(12) United States Patent
Zhou et al.

(10) Patent No.: US 12,369,448 B2
(45) Date of Patent: Jul. 22, 2025

(54) PEROVSKITE SOLAR CELLS WITH FLATTENED GRAIN-BOUNDARY GROOVES AND METHOD FOR MANUFACTURING THE SAME

(71) Applicant: Hong Kong Baptist University, Hong Kong (HK)

(72) Inventors: Yuanyuan Zhou, Hong Kong (HK); Mingwei Hao, Hong Kong (HK)

(73) Assignee: Hong Kong Baptist University, Hong Kong (HK)

( * ) Notice: Subject to any disclaimer, the term of this patent is extended or adjusted under 35 U.S.C. 154(b) by 0 days.

(21) Appl. No.: 18/343,754

(22) Filed: Jun. 29, 2023

(65) Prior Publication Data

US 2024/0164120 A1    May 16, 2024

Related U.S. Application Data

(60) Provisional application No. 63/425,664, filed on Nov. 15, 2022.

(51) Int. Cl.
| | |
|---|---|
| *H10K 30/40* | (2023.01) |
| *H10K 30/50* | (2023.01) |
| *H10K 30/85* | (2023.01) |
| *H10K 71/12* | (2023.01) |
| *H10K 85/50* | (2023.01) |

(52) U.S. Cl.
CPC ............ *H10K 30/40* (2023.02); *H10K 30/50* (2023.02); *H10K 30/85* (2023.02); *H10K 71/12* (2023.02); *H10K 85/50* (2023.02)

(58) Field of Classification Search
None
See application file for complete search history.

(56) References Cited

U.S. PATENT DOCUMENTS

2023/0110770 A1\*    4/2023    Huang ................ B23K 26/362
                                                              438/57

FOREIGN PATENT DOCUMENTS

| CN | 110581221 A | \* | 12/2019 | |
|---|---|---|---|---|
| CN | 112993167 A | \* | 6/2021 | ............. B82Y 10/00 |

OTHER PUBLICATIONS

Q. Dong et al., "Interpenetrating interfaces for efficient perovskite solar cells with high operational stability and mechanical robustness", Nature Communications 12:973 (Year: 2021).\*

(Continued)

*Primary Examiner* — Ryan S Cannon
(74) *Attorney, Agent, or Firm* — IDEA Intellectual Limited; Sam T. Yip

(57) ABSTRACT

A perovskite solar cell includes an electron-transport layer (ETL), a perovskite layer, and an HTL. The ETL is with an additive phase buried therein and disposed over a substrate with a bottom electrode. The perovskite layer is disposed above the ETL and is in contact with the ETL. The perovskite layer includes a plurality of grains which arranged on a top surface of the ETL along a direction, in which two of the adjacent grains have adjacent side surfaces to form a void there between over the top surface of the ETL. The top of the void defines a GBG side-angle with the direction, in which a mean GBG side-angle of the perovskite layer is in a range from 5 degrees to 30 degrees. A HTL is disposed over the perovskite layer and between a top electrode and the perovskite layer.

8 Claims, 16 Drawing Sheets

(56) References Cited

OTHER PUBLICATIONS

Machine translation of CN110581221A (Year: 2019).*
Machine translation of CN112993167A (Year: 2021).*
Q. Dong et al., "Supplementary information: Interpenetrating interfaces for efficient perovskite solar cells with high operational stability and mechanical robustness", Published Apr. 5, 2022 (doi/full/10.1002/adma.202109879) (Year: 2021).*
Z. Zheng et al., "Pre-buried additive for cross-layer modification in flexible perovskite solar cells with efficiency exceeding 22%", Advanced Materials 34:2109879 (Year: 2022).*

* cited by examiner

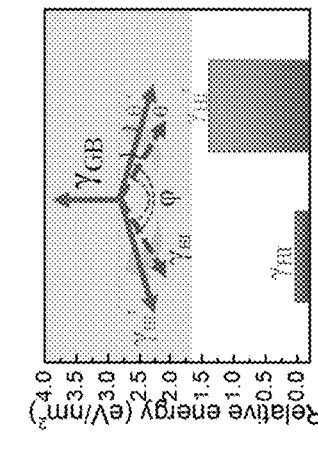
FIG. 3A
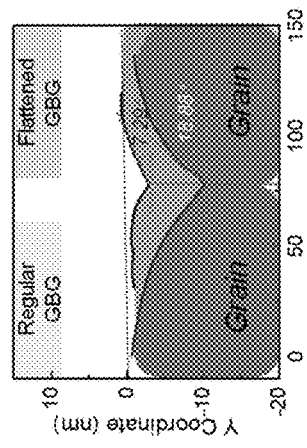
FIG. 3B
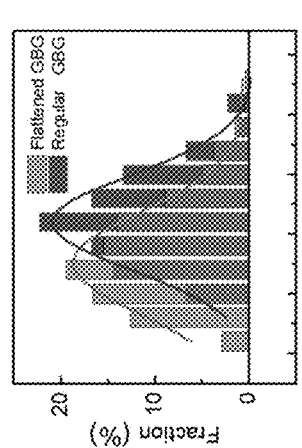
FIG. 3C
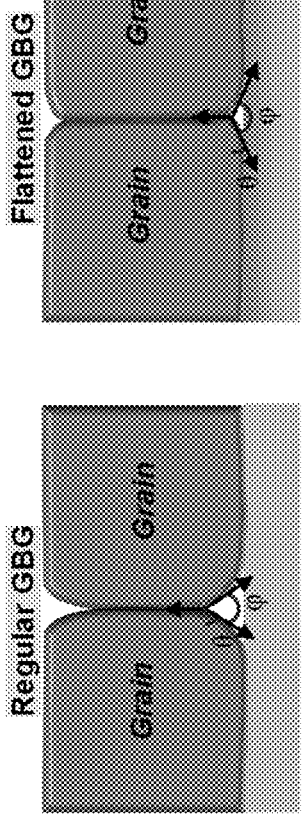
FIG. 3D
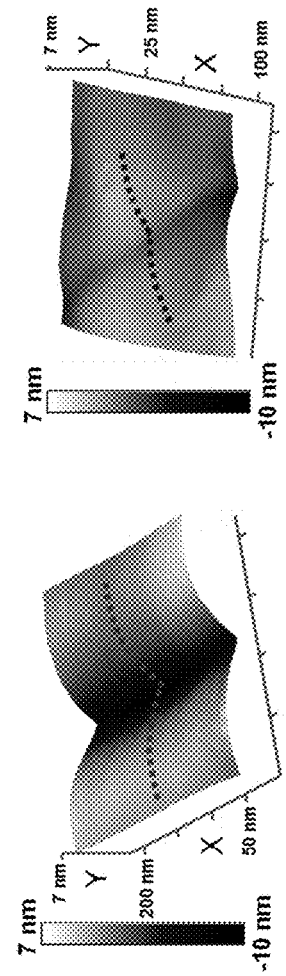
FIG. 3E
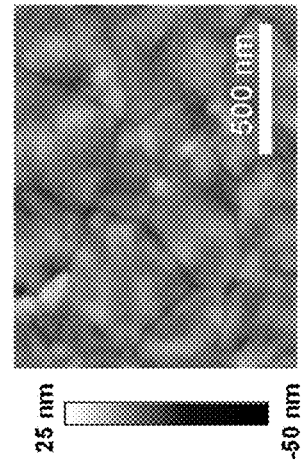
FIG. 3F
FIG. 3G
FIG. 3H
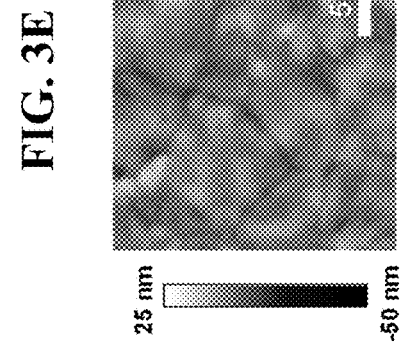
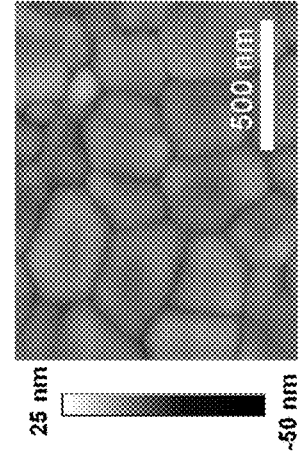
FIG. 3I

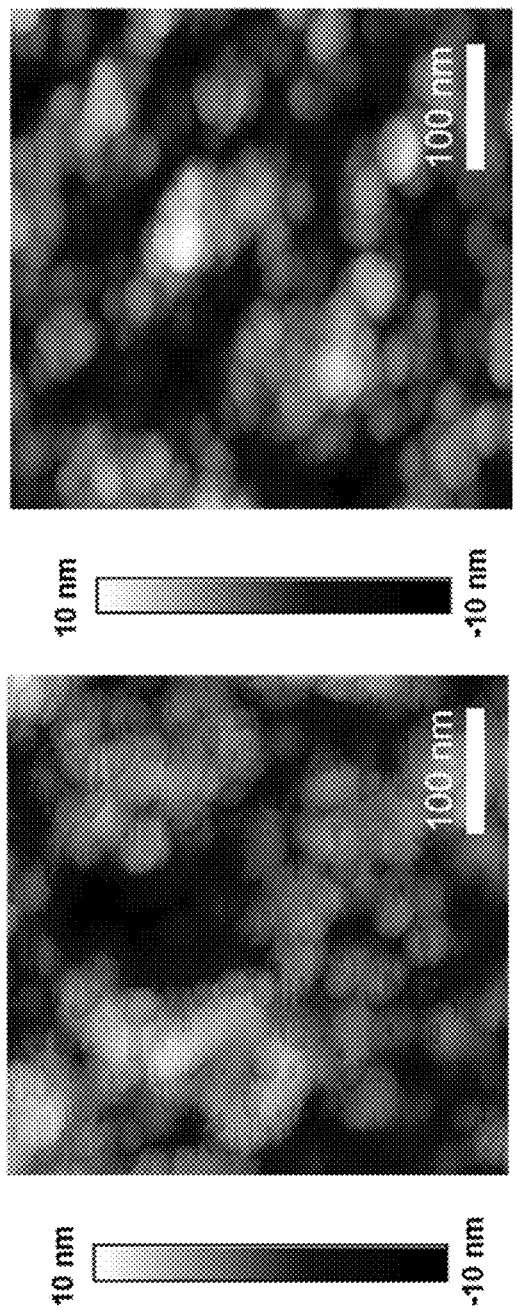
FIG. 4B
FIG. 4A
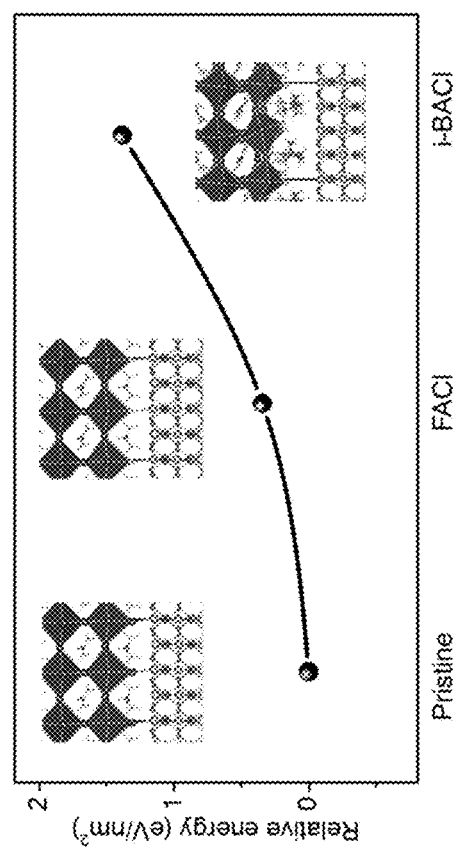
FIG. 5

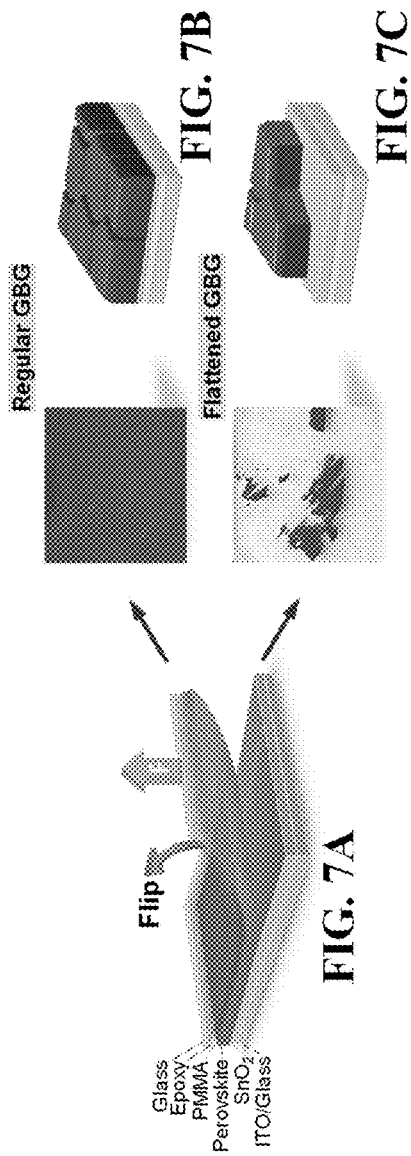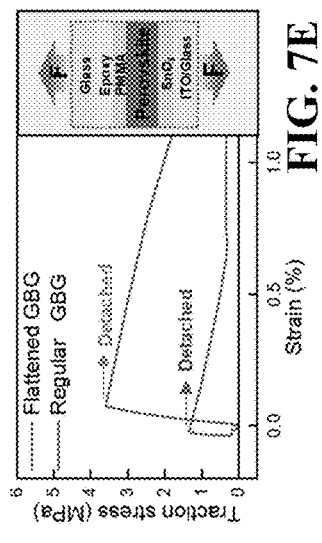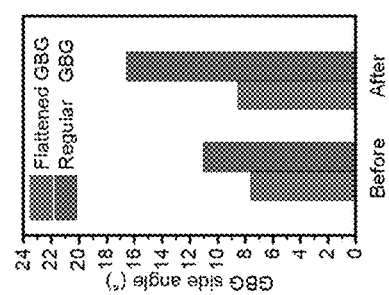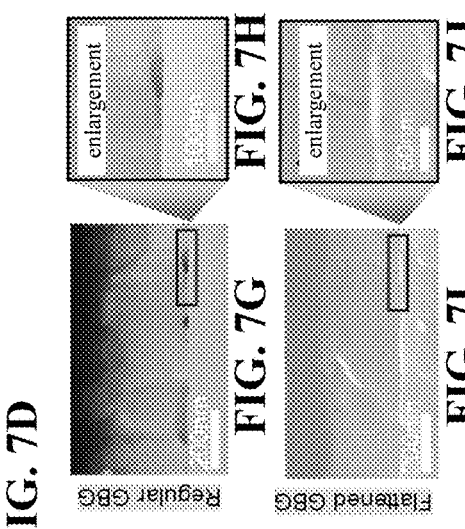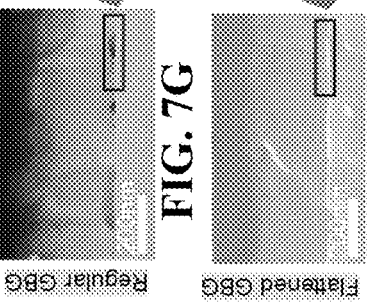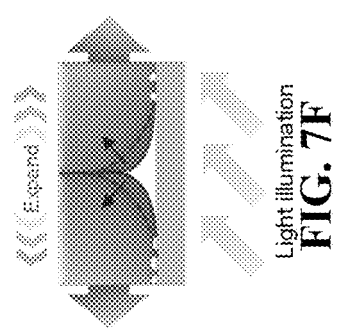
FIG. 7A FIG. 7B FIG. 7C FIG. 7D FIG. 7E FIG. 7F FIG. 7G FIG. 7H FIG. 7I FIG. 7J FIG. 7K

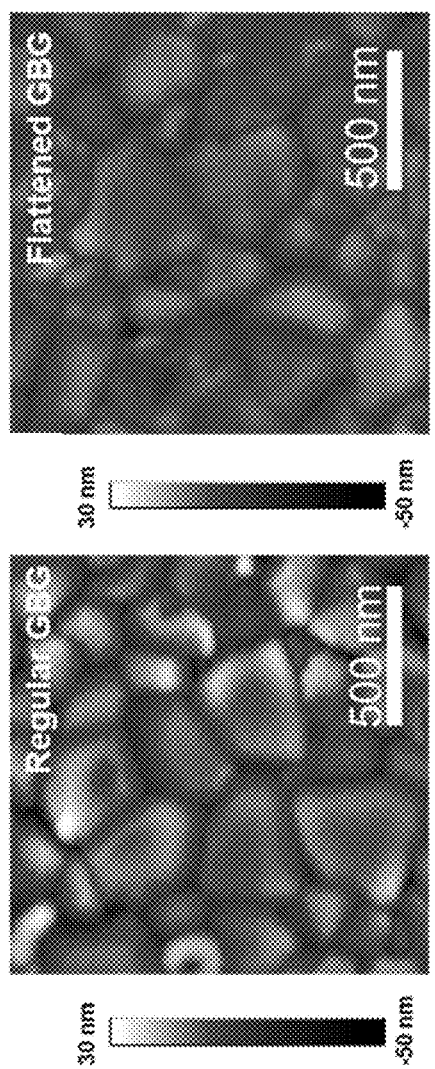
FIG. 11A
FIG. 11C
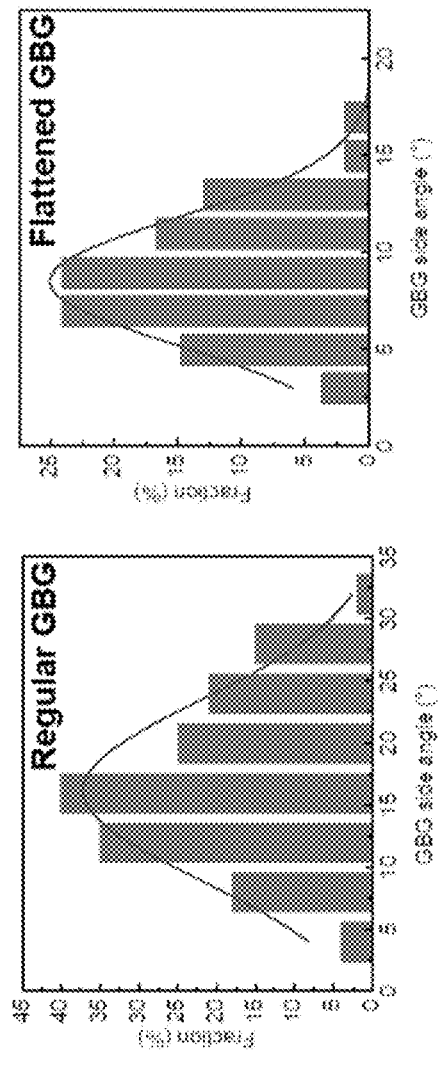
FIG. 11B
FIG. 11D
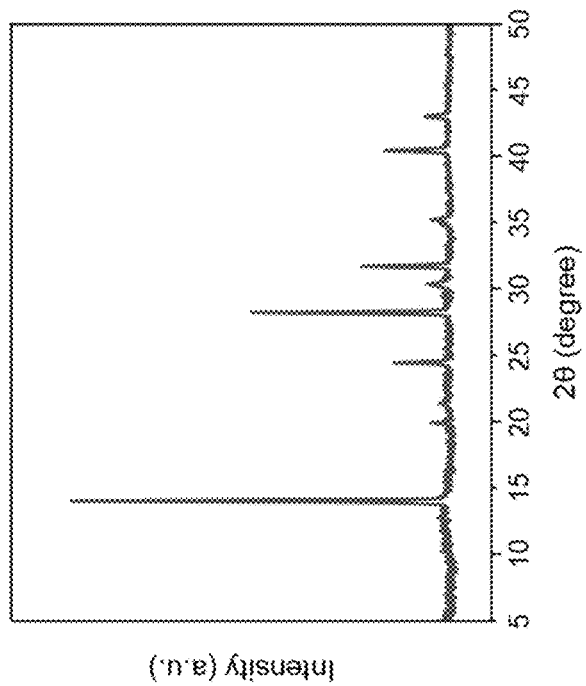
FIG. 12

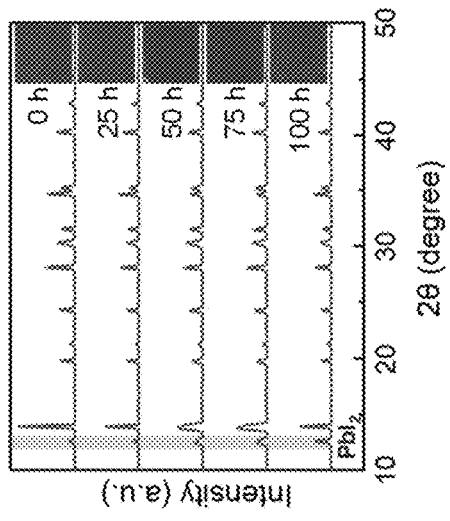
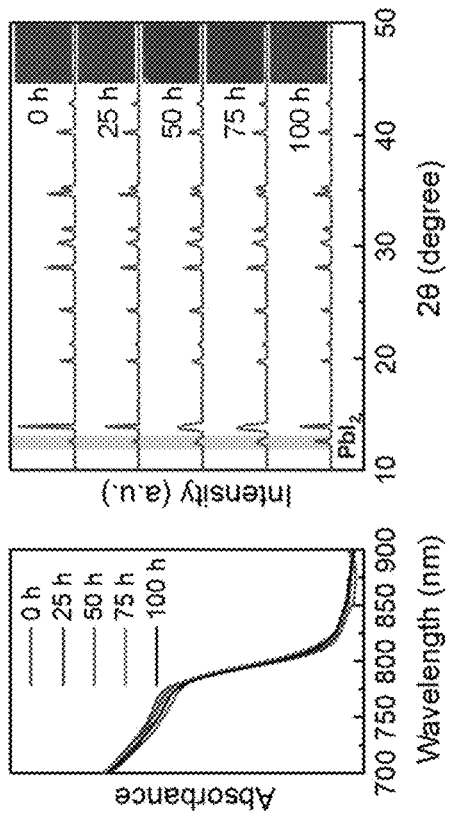
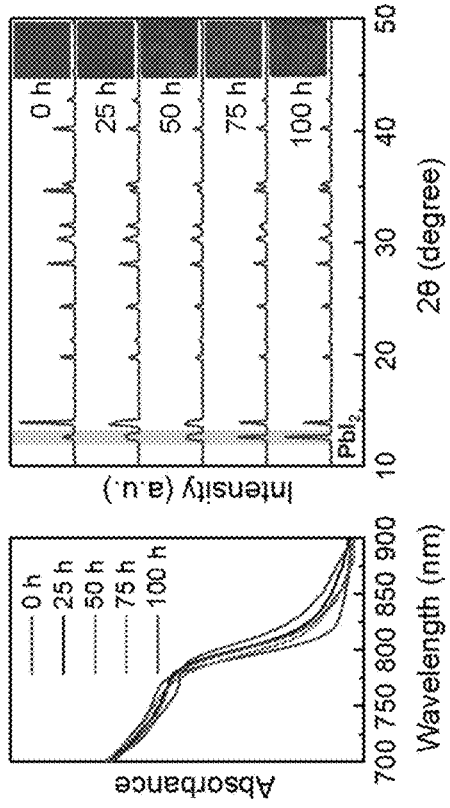
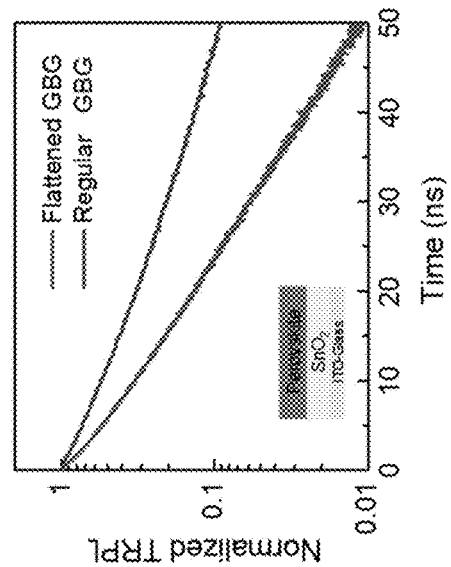
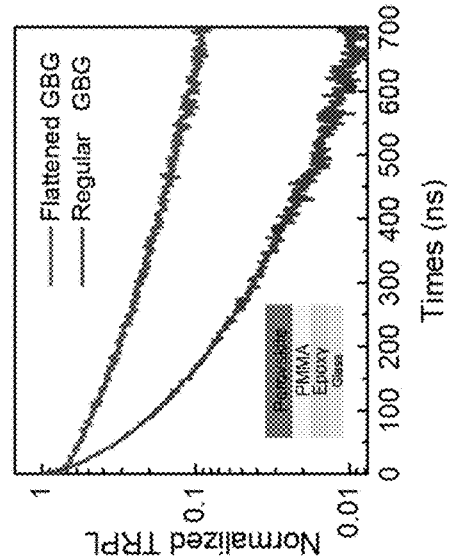
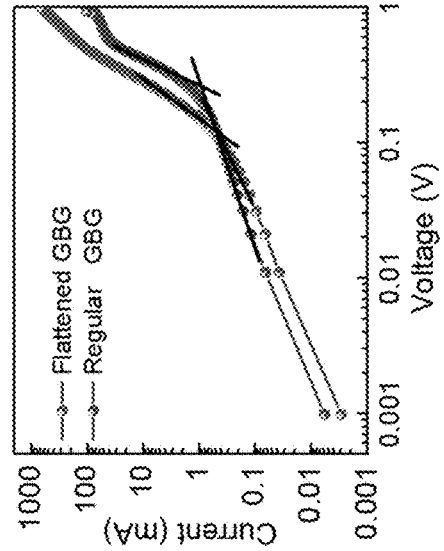
FIG. 13A   FIG. 13B   FIG. 13C   FIG. 13D   FIG. 13E   FIG. 13F   FIG. 13G

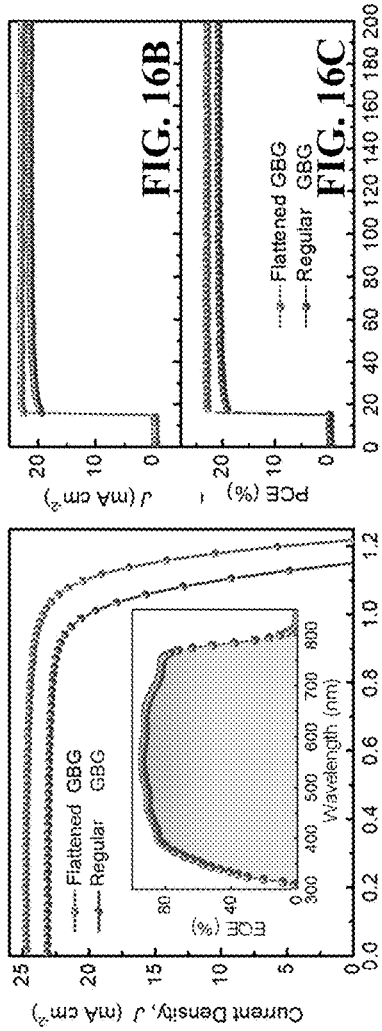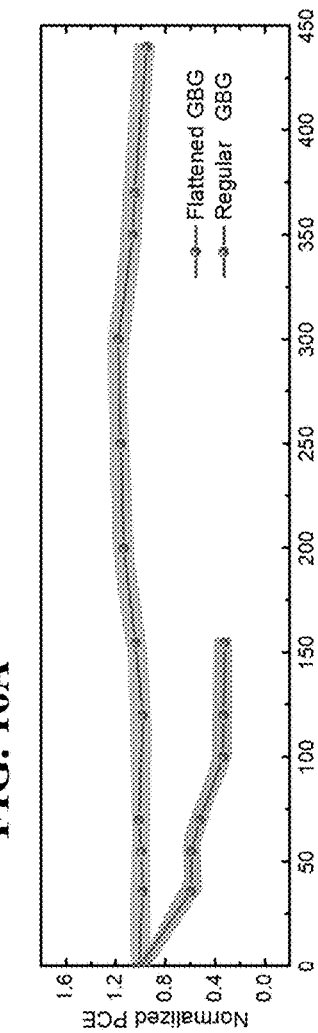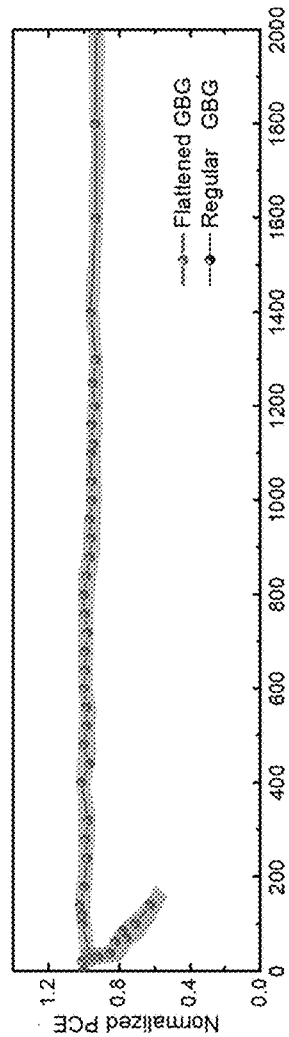
FIG. 16A FIG. 16B FIG. 16C FIG. 16D FIG. 16E

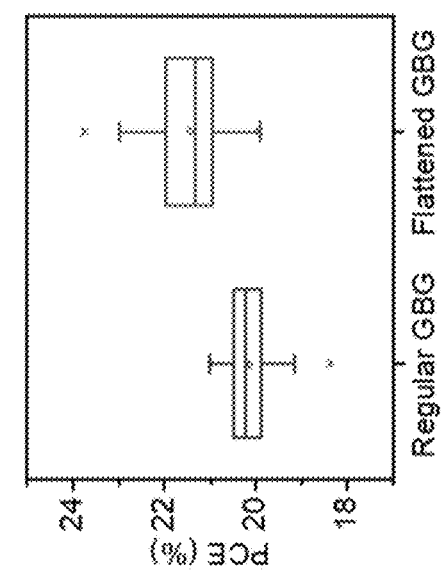
FIG. 17A
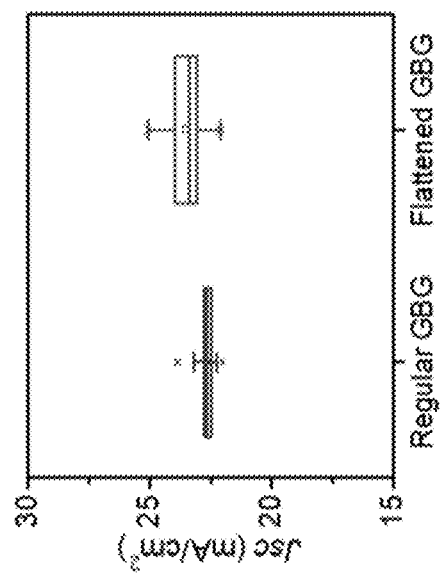
FIG. 17B
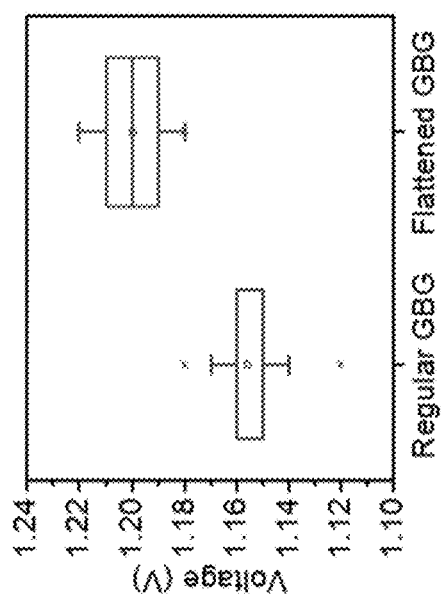
FIG. 17C
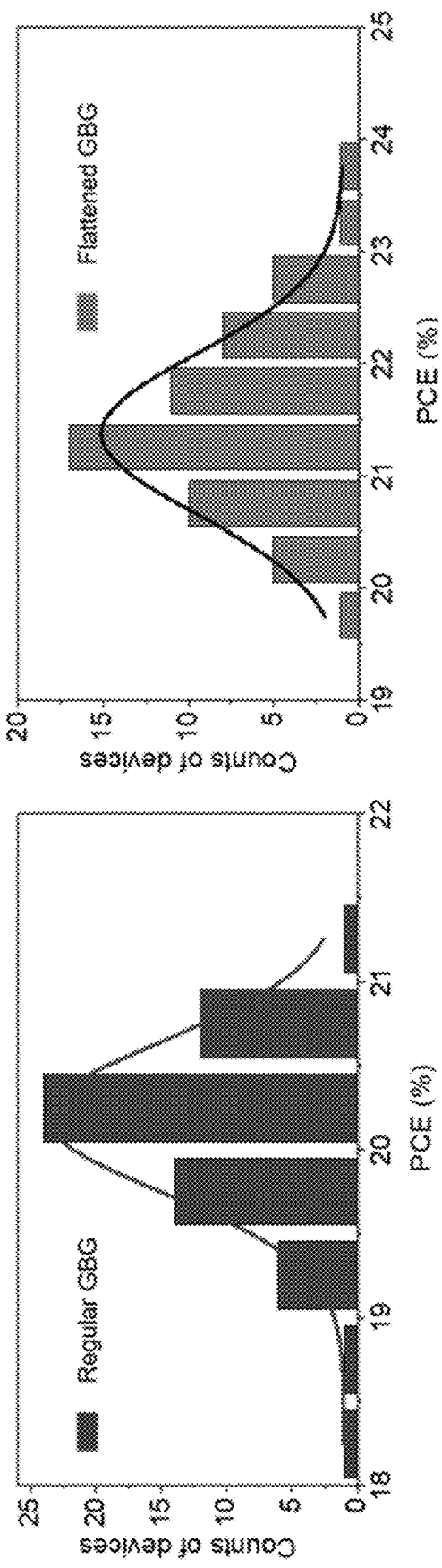
FIG. 17E
FIG. 17D

PEROVSKITE SOLAR CELLS WITH FLATTENED GRAIN-BOUNDARY GROOVES AND METHOD FOR MANUFACTURING THE SAME

CROSS-REFERENCE TO RELATED APPLICATIONS

The present application claims priority from a U.S. provisional patent application Ser. No. 63/425,664 filed 15 Nov. 2022, and the disclosures of which are incorporated by reference in their entirety.

FIELD OF THE INVENTION

The present invention generally relates to perovskite solar cells. More specifically, the present invention relates to perovskite solar cells with flattened grain-boundary grooves.

BACKGROUND OF THE INVENTION

Perovskite solar cells (PSCs) are a type of solar cell that use a class of materials called perovskites as the light-harvesting layer. Perovskites have unique optoelectronic properties, including a high absorption coefficient, long carrier diffusion lengths, and the ability to be solution-processed, which make them promising candidates for next-generation solar cells.

Stability and reliability are major challenges for PSCs due to the susceptibility of perovskites to degradation in the presence of moisture, heat, and light, which can decrease device performance and shorten device lifetime. To address these challenges, various approaches have been explored, including the development of new materials and device architectures, as well as the optimization of fabrication processes.

Opto-mechanical reliability is an important criterion for evaluating the performance and commercialization potential of PSCs due to the mechanical-property mismatch of metal halide perovskites with other device layers. Opto-mechanical reliability refers to the ability of the device to withstand mechanical stresses and deformations without compromising its electrical performance. To improve the opto-mechanical reliability of PSCs, various strategies have been investigated, such as the development of mechanically robust perovskite materials.

Improving the opto-mechanical reliability of PSCs is critical for their successful commercialization and widespread adoption. While various strategies have been investigated, it is still lacking a simple approach to improve the opto-mechanical reliability of PSCs. Therefore, there is a need for continued improvement in the opto-mechanical reliability of PSCs to overcome the issues related to stability and reliability.

SUMMARY OF THE INVENTION

Heterointerfaces between perovskite and carrier-extracting substrates play a critical role in determining the performance of perovskite solar cells (PSCs), which has drawn significant attention in the field. The intrinsic surface morphological characteristics of perovskite films strongly determine the resultant heterointerface microstructures. Grain boundaries (GB s) are the most prominent microstructural feature that emerges onto the film surface and inherently creates grooving morphologies due to the solid-state ion migration driven by the difference between film surface/heterointerface and GB energy. The effects of GB grooves (GBGs) have been rarely discussed.

In PSCs, buried GBGs can create nanoscale physical voids between the perovskite layer and the bottom substrate, which can have detrimental effects for a range of reasons. First, these voids can hinder carrier injection and transport at the heterointerface. Second, these voids can trap environmental gaseous species and processing solvent molecules, influencing the chemical stability. Third and most critically, these voids can trigger interfacial delamination and affect the opto-mechanical properties of the perovskite-substrate heterointerface. For all these considerations, there is a need to tailor GB grooves on the buried perovskite surface to achieve a stable heterointerface with optimal opto-mechanical and opto-electronic properties.

It is an objective of the present invention to provide an apparatus and a method to address the aforementioned shortcomings and unmet needs in the state of the art. In accordance with a first aspect of the present invention, a perovskite solar cell is provided. The perovskite solar cell includes an electron-transport layer (ETL), a perovskite layer, and a hole-transporting layer (HTL). The electron-transport layer is with an additive phase buried therein and disposed over a substrate with a bottom electrode. The perovskite layer is disposed above the electron-transport layer and is in contact with the electron-transport layer. The perovskite layer includes a plurality of grains which arranged on a top surface of the electron-transport layer along a direction, in which two of the adjacent grains have adjacent side surfaces to form a void therebetween over the top surface of the electron-transport layer. The top of the void defines a GBG side-angle with the direction, in which a mean GBG side-angle of the perovskite layer is in a range from 5 degrees to 30 degrees. A hole-transporting layer is disposed over the perovskite layer and between a top electrode and the perovskite layer.

In accordance with a second aspect of the present invention, a perovskite solar cell is provided. The perovskite solar cell includes an electron-transport layer, a perovskite layer, and a hole-transporting layer. The electron-transport layer is with an additive phase buried therein and is disposed over a substrate with a bottom electrode. The additive phase is created by a modifier including iso-butylammonium chloride (i-BACl), organic or inorganic halide ($AX_n$), or combinations thereof, where A is ethylammonium ($EA^+$), guanidinium ($GA^+$), n-propylammonium ($PA^+$), n-butylammonium ($n-BA^+$), cyclohexylammonium ($CA^+$), formamidinium ($FA^+$), methylammonium ($MA^+$) or phenethylamine ($PEA^+$), where X is $I^-$, $Cl^-$, $Br^-$, or a pseudohalide anion which comprises $SCN^-$, $COO^-$, or combinations thereof. The perovskite layer is disposed above the electron-transport layer and is in contact with the electron-transport layer and comprising a plurality of grains which arranged on a top surface of the electron-transport layer along a direction. The hole-transporting layer is disposed over the perovskite layer and between perovskite layer and a top electrode.

In accordance with a third aspect of the present invention, a method for manufacturing a perovskite solar cell is provided. The method includes steps as follows: adding a modifier into a nanoparticle solution to acquire an electron-transport layer solution, in which the modifier includes iso-butylammonium chloride (i-BACl), organic or inorganic halide ($AX_n$), or combinations thereof, where A is ethylammonium ($EA^+$), guanidinium ($GA^+$), n-propylammonium ($PA^+$), n-butylammonium ($n-BA^+$), cyclohexylammonium ($CA^+$), formamidinium ($FA^+$), methylammonium ($MA^+$) or phenethylamine (PEA$^+$), where X is I$^-$, Cl$^-$, Br$^-$, or a pseudohalide anion which comprises thiocyanate (SCN$^-$), carboxylate ion (COO$^-$), or combinations thereof; spin coating the electron-transport layer solution on a substrate with a bottom electrode to form an electron-transport layer with an additive phase buried therein over the substrate; forming a perovskite layer above the electron-transport layer; and forming a hole-transporting layer over the perovskite layer.

In the present invention, high-resolution atomic-force microscopy (AFM) is applied to determine the GB groove angles at the buried perovskite-substrate heterointerface of delaminated, flipped films. A novel method is provided to substantially flatten the GBGs by incorporating iso-butylammonium chloride (i-BACl) additive into SnO$_2$ ETL that triggers the change in the bottom perovskite-ETL heterointerface energies. It is found that morphologically flattened GBGs improved the mechanical adhesion strength of the perovskite layer onto the ETL-coated substrate, making the heterointerface resist long-term photothermal fatigue. The enhanced mechanical integrity owing to small GBG side-angles also imparted excellent optoelectronic properties and high chemical stability. The provided perovskite solar cells are highly efficient and robust under rigorous and standardized stability tests, including maximum-power-point tracking, damp test, and light soaking test.

BRIEF DESCRIPTION OF THE DRAWINGS

Embodiments of the invention are described in more details hereinafter with reference to the drawings, in which:

FIG. 3A-3I illustrate exemplary schematic diagrams for morphology and microstructures at the perovskite-substrate heterointerface of perovskite solar cells without and with GBGs;

FIG. 4A and FIG. 4B are exemplary results of AFM topography images of the pristine ETL and ETL with the pre-buried additional phase, respectively;

FIG. 5 is an exemplary comparison of the relative energy of the perovskite-ETL interface via DFT calculation;

FIGS. 7A-7K illustrate exemplary schematic diagrams for influence of GBGs on mechanical properties and photothermal fatigue resistance of perovskite films;

FIG. 11A and FIG. 11B are exemplary results of AFM images of the buried perovskite-ETL heterointerface with regular and flattened GBGs;

FIG. 11C and FIG. 11D are exemplary and measured GBG side-angle statistics of the buried perovskite-ETL heterointerface with regular and flattened GBGs;

FIG. 12 is X-ray diffraction (XRD) pattern of the perovskite film with the flattened GBG after 100 hours illumination of one-sun-intensity light;

FIGS. 13A-13G illustrate exemplary schematic diagrams for influence of GBGs on chemical stability and optoelectronic properties of perovskite films;

FIGS. 16A-16E are exemplary results of influence of GBGs on photovoltaic performance and stability of PSCs, FIGS. 17A-17C are exemplary results of J-V parameter statistics for the PSCs made with and without GBG engineering;

FIGS. 17D-17E are exemplary results of PCE statistics of PSCs with regular and flattened GBG;

DETAILED DESCRIPTION

In the following description, apparatuses, systems, and/or methods for perovskite solar cells and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
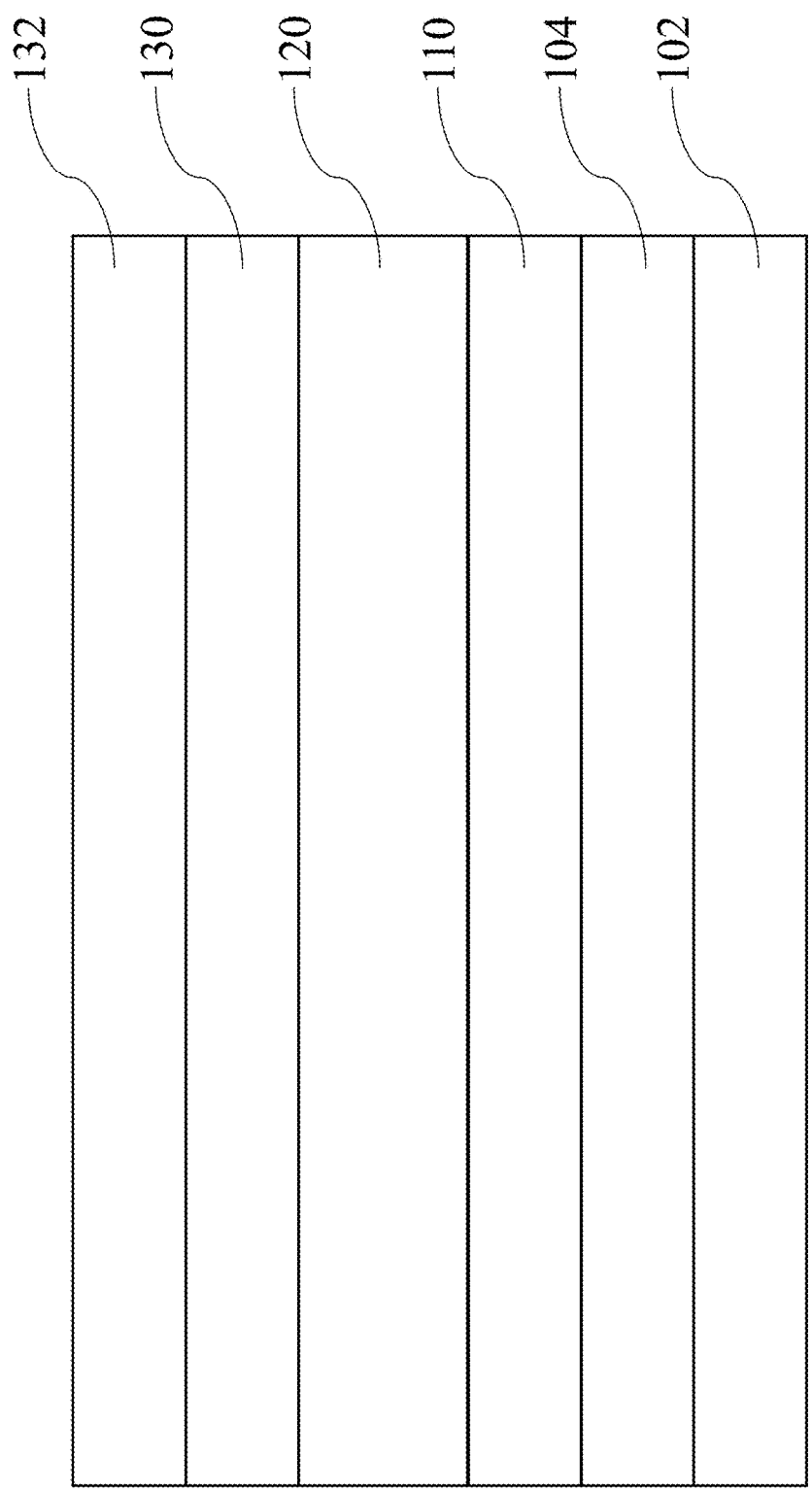
FIG. 1 depicts a schematic diagram of a side view of a perovskite solar cell in accordance with one aspect of the present invention.

FIG. 1 depicts a schematic diagram of a side view of a perovskite solar cell 100 in accordance with one aspect of the present invention. The perovskite solar 100 includes a substrate 102, a bottom electrode 104, an electron-transport layer (ETL) 110, a perovskite layer 120, a hole-transporting layer (HTL) 130, and a top electrode 132.

The bottom electrode 104 is disposed on the substrate 102. For example, the bottom electrode 104 can be coated on the substrate 102. In one embodiment, the substrate 102 is a transparent glass, and the bottom electrode is made of at least one transparent and conductive material, such as indium tin oxide (ITO) or fluorine-doped tin oxide (FTO), and thus a combination of the substrate 102 and the bottom electrode 104 is called an ITO glass substrate or a FTO glass substrate. The ITO or FTO glass substrate is suitable for solar cells where transparency and electrical conductivity are required, which can serve as an illumination receiving side.

Figure 2:
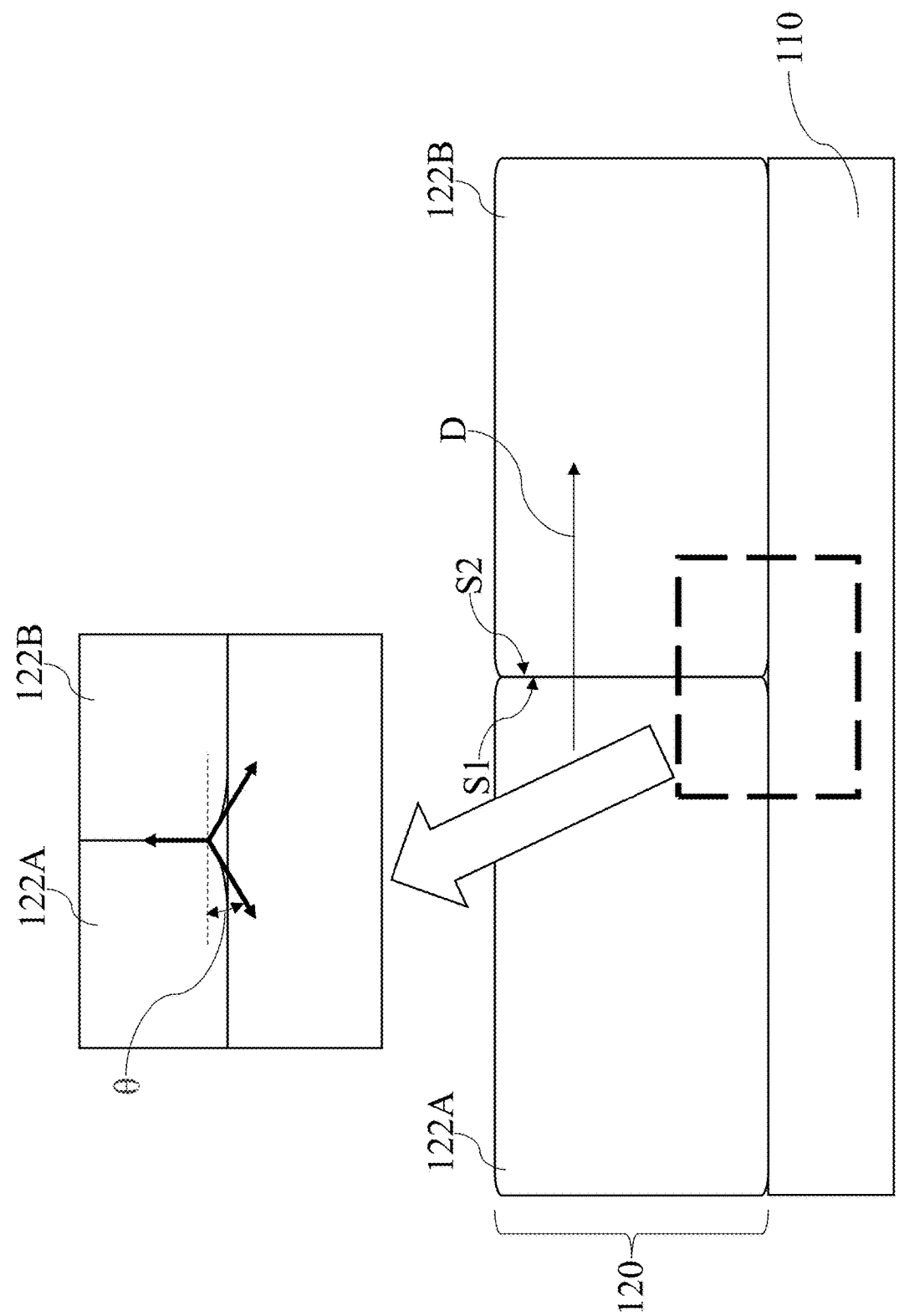
FIG. 2 depicts a schematic diagram of an enlarged view of the ETL and the perovskite layer in accordance with some embodiments of the present invention.

FIG. 2 depicts a schematic diagram of an enlarged view of the ETL 110 and the perovskite layer 120 in accordance with some embodiments of the present invention. The ETL 110 is disposed over the substrate 102 and the bottom electrode 104. The ETL 110 can be a thin film with a high electron mobility so as to facilitate movement of electrons from a light-absorbing layer (e.g., the perovskite layer 120) to the bottom electrode 104 for further extraction. In one embodiment, the ETL 110 can be made of $SnO_2$, $TiO_2$, ZnO, or combinations thereof. The ETL 110 is with an additive phase buried therein to improve the growth of the perovskite layer 120. In one embodiment, the additive phase buried in the ETL 110 can be formed by using a modifier including iso-butylammonium chloride (i-BACl), organic or inorganic halide ($AX_n$), or combinations thereof; where A is ethylammonium ($EA^+$), guanidinium ($GA^+$), n-propylammonium ($PA^+$), n-butylammonium (n-$BA^+$), cyclohexylammonium ($CA^+$), formamidinium ($FA^+$), methylammonium ($MA^+$) or phenethylamine ($PEA^+$); and where X is $I^-$, $Cl^-$, $Br^-$, or a pseudohalide anion which comprises thiocyanate ($SCN^-$), carboxylate ion ($COO^-$), or combinations thereof.

The perovskite layer 120 is disposed above the ETL 110 and in contact with the ETL 110 and includes one or more films configured to absorb light and generate electrical power. In one embodiment, the perovskite layer 120 may include $FA_{0.9}Cs_{0.1}PbI_3$ or $FA_{0.9}Cs_{0.1}PbI_3$ or $FA_{0.9}Cs_{0.07}MA_{0.03}Pb(I_{0.92}Br_{0.08})_3$; In some embodiments, the perovskite layer 120 may include a perovskite material as any composition with a chemical structure of $ABX_3$, where A is an organic or alkali cation, including but not limit to methylammonium ($MA^+$), formamidinium ($FA^+$), and cesium ($Cs^+$); B is usually $Pb^{2+}$ or $Sn^{2+}$; X is P, $Cl^-$, or Br.

As show in FIG. 2, the perovskite layer 120 includes a plurality of grains 112A, 112B, which arranged on a top surface of the ETL 110 along a direction D, in which two of the adjacent grains 112A, 112B have adjacent side surfaces S1 and S2 to form a void therebetween over the top surface of the ETL 110. A top of the void defines a grain boundary groove (GBG) side-angle θ with the direction D1 (i.e., with the horizontal line), in which a mean GBG side-angle of the perovskite layer 120 is in a range from 5 degrees to 30 degrees. In some embodiments, the mean GBG side-angle of the perovskite layer 120 is in a range from 5 degrees to 20 degrees. In some embodiments, the mean GBG side-angle of the perovskite layer 120 is in a range from 5 degrees to 10 degrees. The different ranges of the mean GBG side-angle can be achieved by tuning process recipes according to the targeted requirements. Herein, the term "mean GBG side-angle" refers to the average value obtained from multiple measurements taken at a specific unit area; for example, at least 100 measurements onto different locations within a relatively large scanned area (2*2 $\mu m^2$). The morphology as illustrated in FIG. 2 with such the GBG side-angle θ can be referred to as a flattened GBGs.

Referring back to FIG. 1; the HTL 130 is disposed over the perovskite layer 120 and between the perovskite layer 120 and the top electrode 132. The HTL 130 is configured to transport positively charges (e.g., holes) that are generated in the perovskite layer 120 to the top electrode 132. In one embodiment, the HTL 130 is made of Spiro-OMeTAD; in some embodiments, the HTL 130 includes at least one hole-transporting material, such as poly(triaryl amine) (PTAA), poly(3,4-ethylenedioxythiophene) polystyrene sulfonate (PEDOT:PSS), poly(3-hexylthiophene-2,5-diyl) (P3HT), or $NiO_x$. In one embodiment, the top electrode 132 is made of Au; in some embodiments, the top electrode 132 includes Ag, Au, or Al.

By this configuration, the inclusion of the additive phase in the ETL 110 results in flattened GB grooves, achieving an opto-mechanically reliable ETL-perovskite heterointerface that is resistant to photothermal fatigue. The improved mechanical integrity of the ETL-perovskite heterointerface also facilitates charge transport and enhances chemical stability by promoting carrier injection and reducing moisture or solvent trapping, respectively.

Regarding the enhancement to the stability, the perovskite layer 120 can have stable optoelectronic properties/characters and stable solar cell performance with respect to time, such as stable absorbance, stable power conversion efficiency (PCE). In some embodiments, the perovskite layer 120 can have absorbance with respect to 760 nm defined as "A" before a stability testing with 22° C. and 65% relative humidity in 250 hours, and the same perovskite layer 120 has the absorbance measured as "B*A" after the stability testing, where B is in a range between 0.8 and 1. In some embodiments, the perovskite layer 120 has power conversion efficiency defined as "PCE" before a damp heat testing with 85° C. and 85% relative humidity, and the perovskite layer 120 has the power conversion efficiency measured as "C*PCE" after the damp heat testing in 400 hours, where C is in a range between 0.9 and 1. In some embodiments, the perovskite layer 120 has power conversion efficiency defined as "PCE" before a light soaking testing with one-sun-intensity light generated by white LEDs and with nitrogen flowing, and the perovskite layer 120 has the power conversion efficiency measured as "D*PCE" after 150 hours of the light soaking testing, where D is in a range between 0.9 and 1. In some embodiments, the perovskite layer 120 has a trap density in a range from $1.5*10^{14}$ $cm^{-3}$ to $1.6*10^{14}$ $cm^{-3}$.

Regarding the improved mechanical integrity, the perovskite layer 120 can have stable structural feature; for example, in some embodiments, the perovskite layer 120 still has the mean GBG side-angle in a range from 5 degrees to 10 degrees after a photothermal fatigue test in 100 hours that the perovskite layer 120 is under stimulated AM 1.5G continuous one-sun illumination and has a photothermally induced sample temperature of 50° C. Moreover, by the improved mechanical integrity, the perovskite layer 120 can have great structural strength with the ETL 110. In some embodiments, the perovskite layer 120 is adhered to the ETL 110, and the tensile strength between the perovskite layer 120 and the ETL 110 is in the range of 2.3 MPa to 2.5 MPa. In some embodiments, the perovskite layer 120 is adhered with the ETL 110, and an average specific fracture energy between the perovskite layer 120 and the ETL 110 is measured to be in a range from 8500 $kJ/m^3$ to 9000 $kJ/m^3$.

Further details of the testing and proof of these improvements are described as follows.

FIG. 3A-3I illustrate exemplary schematic diagrams for morphology and microstructures at the perovskite-substrate heterointerface of perovskite solar cells without and with GBGs, in which: FIG. 3A and FIG. 3B are schematic illustrations showing the difference between regular and flattened GBGs at the buried perovskite-substrate heterointerface; FIG. 3C is an exemplary result of density functional theory-calculated (DFT-calculated) heterointerface energies of perovskite films without and with GBGs, which schematically illustrates the impact of heterointerface energy on GBG side-angles; FIG. 3D and FIG. 3E are exemplary results of high-resolution atomic force microscopy (AFM) 3D images; FIG. 3F is a schematic illustration showing the surface height profiles of regular and flattened GBGs, and the dash lines in FIGS. 3D and 3E indicate where the surface height profiles in FIG. 3F are acquired; FIG. 3G and FIG. 3H are exemplary results of AFM topography images; and FIG. 3I is an exemplary result of statistical distributions of GBG side-angles based on 100 measurements at different GB locations. Herein, flipped film samples may be used, which can be prepared using a film delamination method described in the later experimental statement.

Referring to FIG. 3A, the geometrical morphology of a regular GBG cross-section is schematically illustrated. Herein the GB groove geometry at a perovskite-ETL heterointerface is inherently determined by the ratio of GB energy to heterointerface energy as follows:

$$\gamma_{GB}/\gamma_{HI}=2\cos(\varphi/2)=2\sin(\theta)$$

where $\gamma_{GB}$ is the GB energy, $\gamma_{HI}$ is the heterointerface energy, $\varphi$ and $\theta$ is the dihedral and side angles of a GBG as illustrated in FIG. 3A, respectively. According to the equation, by maintaining the GB energy, an increase in heterointerface energy can lead to the flattening of GBGs morphologies via a reduction in the GBG side-angle ($\theta$). In practice, tailoring of heterointerface energies can be achieved using interfacial chemical modifications. Therefore, an additive phase is deliberately pre-buried in the deposited ETL and this is found effectively to flatten all GBGs at the buried perovskite-ETL heterointerface. It is confirmed that the surface morphology of $SnO_2$ ETL with pre-buried i-BACl is as uniform as that of pristine $SnO_2$ ETL, shown in FIG. 4A and FIG. 4B which are exemplary results of AFM topography images (400*400 $nm^2$) of the pristine $SnO_2$ ETL and the pre-buried i-BACl $SnO_2$ ETL, respectively.

Referring to FIG. 3B which schematically illustrates that the reduction of the GBG side-angle immediately enhances the interfacial contact at the perovskite-ETL heterointerface in the film structure, in order to quantify the GBG angles, the perovskite films are peeled off from the ETL-coated substrate and performed high-resolution AFM scanning onto the flipped perovskite films.

Figure 6B:
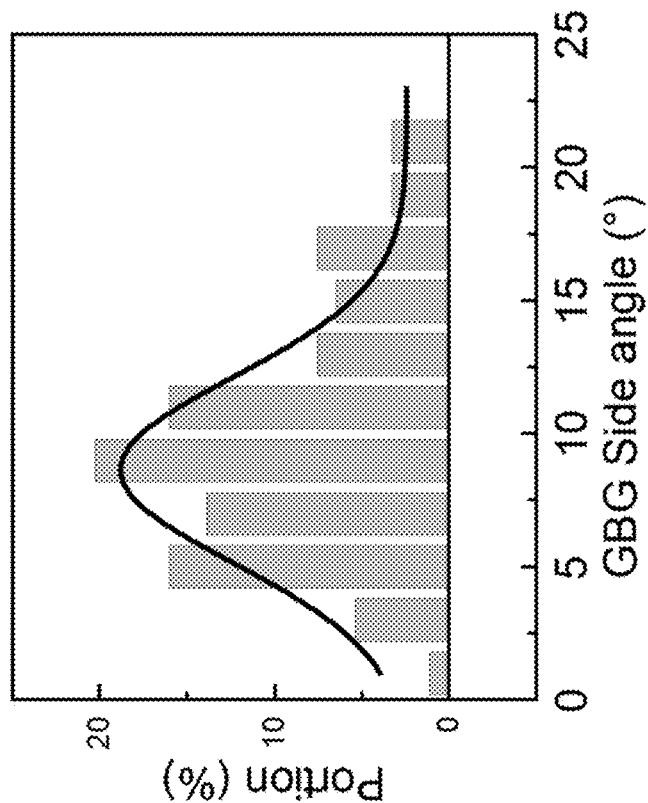
FIG. 6B is an exemplary result of statistical distribution of GBG side-angles based on measurements at various GB locations.
Figure 6A:
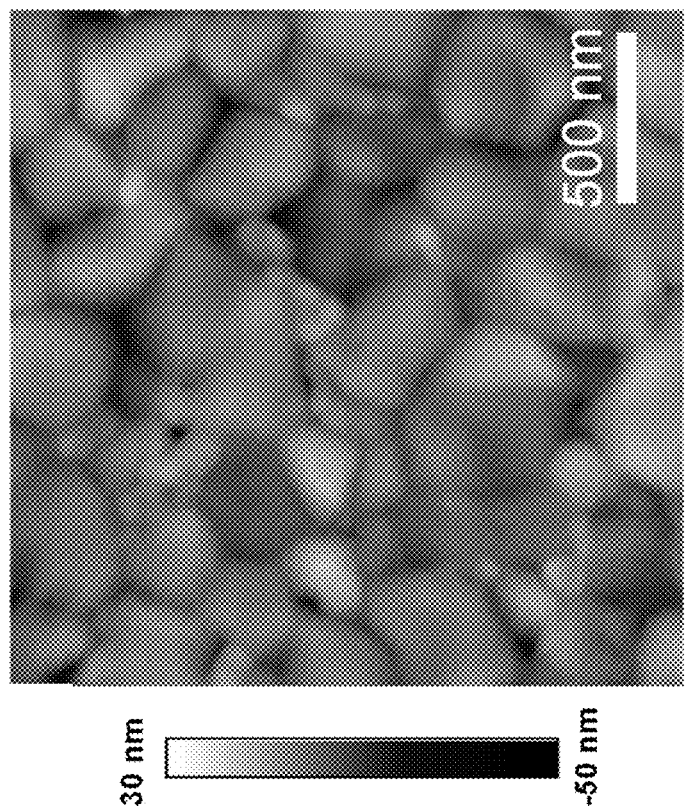
FIG. 6A is an exemplary result of AFM topography image of the perovskite film bottom surface.

Referring to FIG. 3D and FIG. 3E which show the 3D AFM views of the flipped perovskite bottom surfaces without and with the GBG engineering (i.e., the regular GBG and the flattened GBG), the corresponding surface height profiles extracted from FIG. 3D and FIG. 3E are compared in FIG. 3F, revealing a dramatic decrease in the GBG side-angle from 18.88° to only 7.29°. In order to obtain statistical evidence for this effect, the surface height profiles are acquired based on at least 100 measurements onto different GBG locations within a relatively large scanned area (2*2 $\mu m^2$). The AFM topography images for perovskites films without and with the GBG engineering (i.e., the regular GBG and the flattened GBG) are presented in FIG. 3G and FIG. 3H. According to the histograms of the measured GBG side-angles, the mean GBG side-angle is reduced from 11.01° to 7.56° by the GBG engineering (i.e., the flattened GBG). The first-principle calculations using DFT is further performed to reveal the impact of i-BACl chemical modification on the heterointerface energies. The crystallographic models are illustrated in FIG. 5, which is an exemplary comparison of the relative energy of the perovskite-$SnO_2$ interface of pristine $SnO_2$, formamidine hydrochloride (FACl) pre-buried $SnO_2$, and i-BACl pre-buried $SnO_2$ via DFT calculation. The calculation results in reveal that when the heterointerface modified with i-BACl, the heterointerface relative energy is increased to 1.387 $eV/nm^2$ when setting the pristine heterointerface as 0 $eV/nm^2$. In other embodiments, $FA_{0.6}i$-$BA_{0.4}Cl$ is also employed to tailor the film bottom surface which leads to a mean GBG side-angle of 9.05°, as shown FIG. 6A and FIG. 6B, in which FIG. 6A is an exemplary result of AFM topography image (2*2 $\mu m^2$) of the perovskite film bottom surface prepared with pre-buried $FA_{0.6}BA_{0.4}Cl$ in $SnO_2$ ETL and FIG. 6B is an exemplary result of statistical distribution of GBG side-angles based on 144 measurements at various GB locations. The GBG side-angle variation trend for the three samples (pristine, $FA_{0.6}i$-$BA_{0.4}Cl$, i-BACl) is consistent with the heterointerface energy change when different organic cations are used, as shown in FIG. 5, attesting the proposed mechanism for the tailoring of GBG side-angle.

Details of the testing and proof regarding mechanical properties and photothermal fatigue resistance are described as follows.

FIGS. 7A-7K illustrate exemplary schematic diagrams for influence of GBGs on mechanical properties and photothermal fatigue resistance of perovskite films, in which FIG. 7A is a schematic illustration showing the film delamination process for qualitatively evaluating the mechanical reliability of the buried perovskite-ETL heterointerface; FIG. 7B and FIG. 7C are exemplary result of optical photos (0.8 cm*0.8 cm) and corresponding microstructural illustrations for the flipped perovskite films that be peeled off from the ETL-coated ITO substrates, in which FIG. 7B is without GBG engineering and FIG. 7C is with GBG engineering; FIG. 7D is exemplary result of statistical distributions of the normalized areas of the peeled-off film without and with GBG engineering based on 50 films each case, in which normalized area is defined by the ratio of delaminated film area to the whole film area; FIG. 7E are exemplary stress-displacement curves for quantitatively measuring the mechanical strengths of the perovskite-ETL heterointerface with and without GBG engineering with the experimental setup for the measurement; FIG. 7F is a schematic illustration showing the photothermal influence on the perovskite-ETL heterointerface with GBGs, in which the relatively larger thermal expansion coefficient of perovskite (as compared with the substrate) triggers the generation of near-GBGs interfacial voids, together with GBG deepening and widening; FIG. 7G-7J are exemplary results of cross-sectional SEM images showing the microstructural evolution of PSCs after 100 hours illumination with a particular focus on GBG areas, in which FIG. 7G and FIG. 7H are regular GBGs and FIG. 7I and FIG. 7J are flattened GBGs; and FIG. 7K shows an exemplary result of comparison of GBG side angle changes after 100 hours illumination.

Figure 8A:
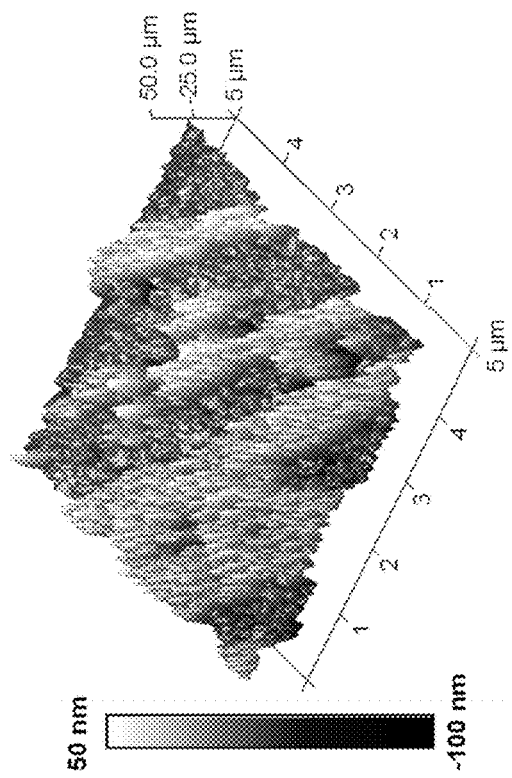
FIG. 8A and FIG. 8B are exemplary results of AFM images showing the existence of nanoparticles on the flipped bottom perovskite surface with GBG engineering.
Figure 8B:
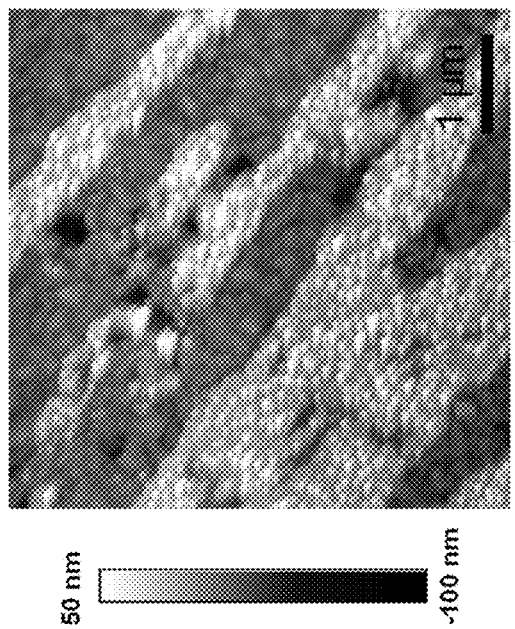
Figure 8C:
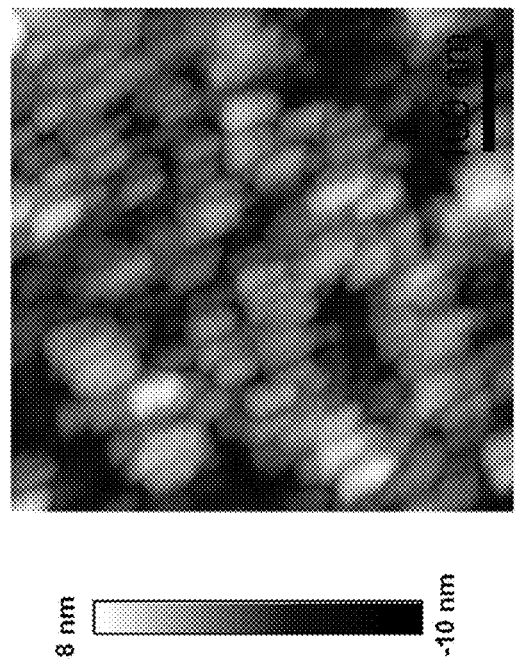
FIG. 8C and FIG. 8D are exemplary results of higher-resolution AFM images confirming the nanoparticle from morphology.
Figure 8D:
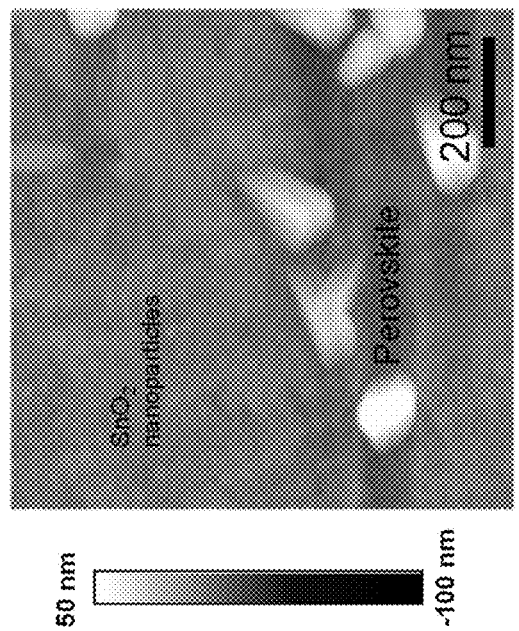

The effect of GBG side-angle reduction on the (opto-) mechanical behavior of the buried perovskite-ETL heterointerface is examined. First, the interlayer delamination tests are performed to compare the intrinsic mechanical reliability of the perovskite-ETL heterointerfaces with and without the GBG engineering. Here the film sample specimens are made with a multi-layer structure of glass/ITO/$SnO_2$(ETL)/ $FA_{0.9}Cs_{0.1}PbI_3$ perovskite/poly(methyl methacrylate) (PMMA)/epoxy/glass. As schematically illustrated in FIG. 7A, by applying a constant force (F) from one edge of the film, the perovskite film is gradually delaminated from the ETL-coated ITO glass. Note that in general, the perovskite-ETL heterointerface is mechanically weakest as compared with other interfaces in this sample setting. In this regard, the delaminated perovskite film area (normalized using the exact area being divided by the original area) qualitatively reflects the mechanical adhesion strength of the perovskite film onto the ETL-coated substrate. FIG. 7B and FIG. 7C show the photographs of typical delaminated perovskite films without and with the GB G engineering, respectively. As seen, the perovskite layer with regular GBGs can be peeled off near-completely from the substrate. On the contrary, when GBGs are flattened, only a small fraction of the film area can be delaminated, indicative of significant improvement in the mechanical integrity of the perovskite-ETL heterointerface. The film delamination tests are performed for 50 samples for each case for statistical evidence. As shown in FIG. 7D, after the GBG engineering, the mean normalized delaminated area of the standard perovskite film sample (0.8*0.8 cm$^2$) is reduced to less than 0.1. As comparison, the perovskite film with regular GBGs exhibits a mean normalized area of 0.65. These results confirm the superior mechanical reliability of the perovskite-ETL heterointerface with the GBG engineering. In addition, there is microstructural evidence on the greatly enhanced heterointerface. It is noticed that once GBGs are engineered, in some areas of the delaminated flipped film, traces of $SnO_2$ nanoparticles are evident as shown in FIG. 8A to FIG. 8D, in which FIG. 8A and FIG. 8B are exemplary results of AFM images (5*5 μm$^2$) showing the existence of $SnO_2$ nanoparticles (delaminated from the ETL) on the flipped bottom perovskite surface with GBG engineering; and FIG. 8C and FIG. 8D are exemplary results of higher-resolution AFM images confirming the $SnO_2$ nanoparticle from morphology. Therefore, it reflects the strong perovskite-ETL heterointerface that pulls out $SnO_2$ from the ETL during the interlayer delamination.

Figure 9C:
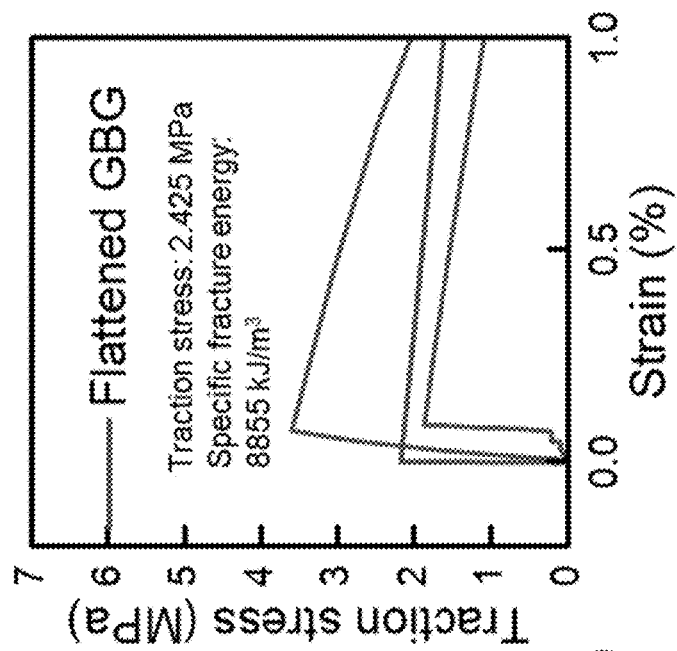
FIG. 9B and FIG. 9C are exemplary results of the stress-displacement curves for mechanical strengths of the perovskite-ETL heterointerface with and without GB G engineering.
Figure 9B:
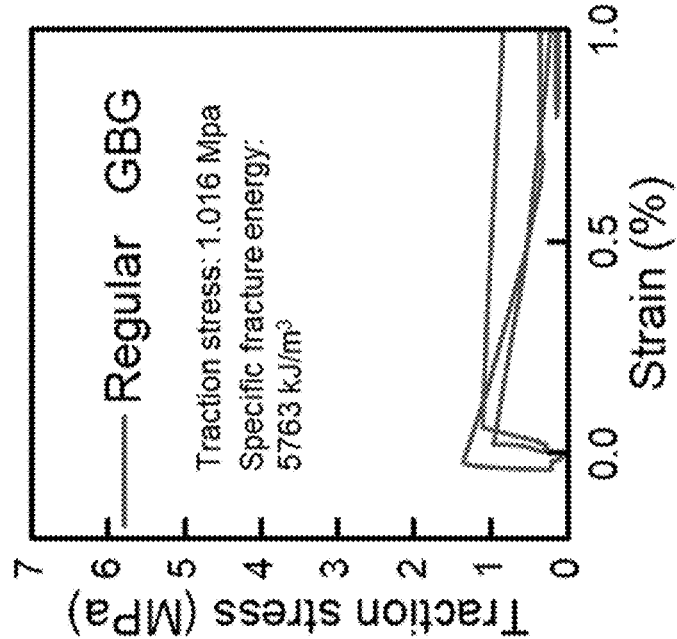
Figure 9A:
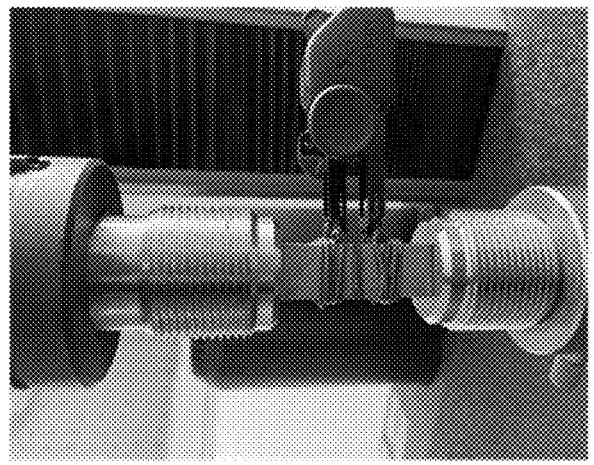
FIG. 9A is a schematic illustration of double-cantilever beam delamination technique set up.

Then, quantitative measurement is performed for the mechanical strength of the perovskite-ETL heterointerface by using a double-cantilever beam delamination technique later, which refers to the later experiment statements and is shown in FIG. 9A, FIG. 9B, and FIG. 9C, in which FIG. 9A is a schematic illustration of double-cantilever beam delamination technique set up; and FIG. 9B and FIG. 9C are exemplary results of the stress-displacement curves for mechanical strengths of the perovskite-ETL heterointerface with and without GBG engineering with three samples for each group.

FIG. 7E shows the traction stress changes applied to the sample until the full detachment of the perovskite layer from the $SnO_2$ ETL. To compare the mechanical strength of regular GBGs and flattened GBGs samples, the maximum traction stress and specific fracture energy of the perovskite-ETL heterointerface are calculated using the later experimental statement. After the calculation, the sample with flattened GBGs delivers a significantly increased maximum traction stress of 3.583 MPa as compared to that (1.079 MPa) for the regular GBG case, which means the heterogeneous interface with flattened GBGs is more resistant to tensile forces. Then, as compared the specific fracture energy of the two samples, the sample with flattened GBGs has a significantly higher specific fracture energy of 12645 kJ/m$^3$ than the regular GBG case (3372 kJ/m$^3$), which means higher energy is required to create one unit area of a crack between the perovskite-ETL with flattened GBGs. The mechanical strengths of both film structures are also measured statistically, as shown in FIG. 5B and FIG. 5C, average traction stresses of 2.425 MPa and 1.016 MPa and average specific fracture energy of 8855 kJ/m$^3$ and 5763 kJ/m$^3$ are showed for the cases of flattened and regular GBGs, respectively. The above results support that the flattened GBGs lead to enhanced mechanical reliability of the perovskite-ETL heterointerface.

Figure 10B:
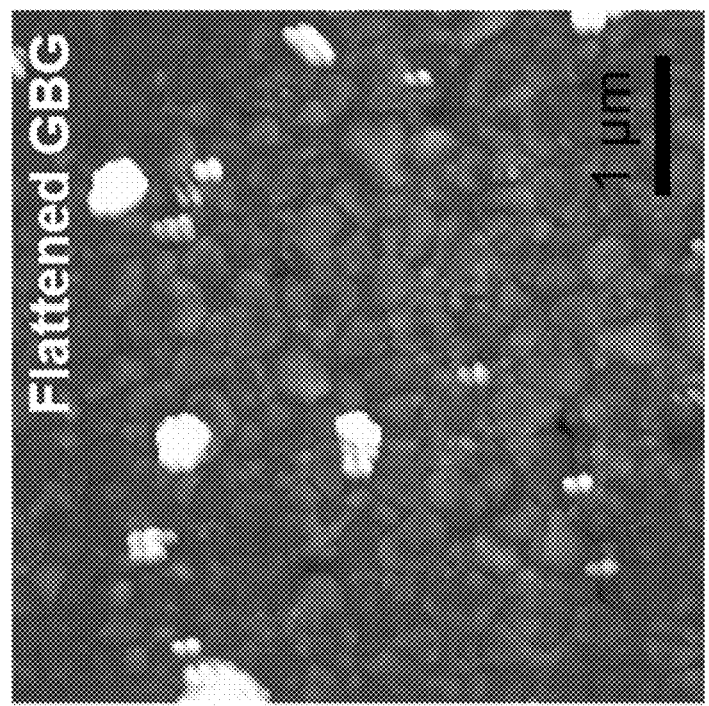
FIG. 10A and FIG. 10B are exemplary results of AFM images showing the microstructure of the perovskite bottom surface with regular GBGs and flattened GBGs, respectively.
Figure 10A:
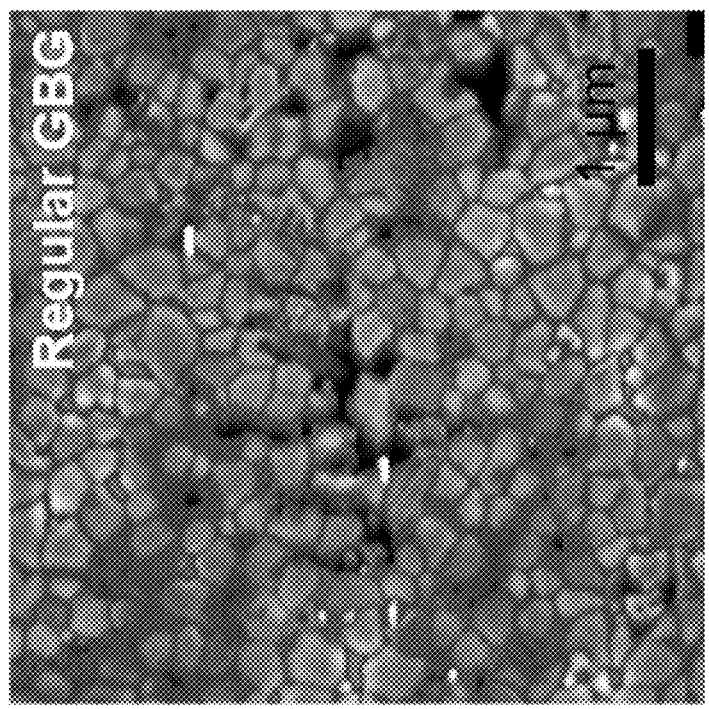

Photothermal fatigue experiments are performed to compare the opto-mechanical reliability of the two perovskite-ETL heterointerfaces by placing the films (in the PSC device setting) under continuous one-sun-intensity illumination, coupled with a photothermally induced sample temperature of 50° C. As schematically illustrated in FIG. 7F, the light induces thermal effects that can trigger the morphological evolutions of GBGs and the heterointerface. As recognized, perovskites exhibit much higher expansion coefficients (3.3 to 8.4×10$^{-5}$ K$^{-1}$) than those of inorganic ETLs (0.37 to 1×10$^{-5}$ K$^{-1}$). Upon photothermal effects, the film tends to expand more than the ETL-coated substrate, causing tensile strain and thus interfacial sliding. The enhanced mechanical strength, coupled with the flattened GBGs, is expected to prevent the generation of interfacial voids and delamination more effectively. The film cross-sections are acquired using scanning electron microscope (SEM) to compare the photothermal fatigue degree of both perovskite-ETL heterointerface types in response to an identical illumination stress. As seen in FIG. 7G to FIG. 7H, after 100 hours continuous photothermal stress, significant voids are formed at the perovskite-ETL heterointerface with regular GBGs, mostly in the near-GB regions. The higher-resolution SEM image in FIG. 7H clearly shows the enlarged details of the voids with the diameter of about several nanometers and the tendency of perovskite-$SnO_2$ ETL interlayer delamination. However, for the perovskite film with flattened GBGs, the perovskite-ETL heterointerface is still very compact even after 100 hours illumination, without noticeable voids generation or interface delamination, as shown FIG. 7I to FIG. 7J. The AFM images of the buried perovskite-ETL heterointerface can further confirmed the different morphological changes of the films with regular GBGs and flattened GBGs, as shown in FIG. 10A and FIG. 10B which are exemplary results of AFM images (5*5 μm$^2$) showing the microstructure of the perovskite bottom surface after 100 hours photothermal stress with regular GBGs and flattened GBGs, respectively. On a further consideration, the high surface activities at GBGs may lead to the migration of loosely bonded ions, further contributing to the volume expansion of GBG structures.

To further confirm this, AFM is used to probe the GBGs of the bottom perovskite surface after 100 hours photothermal stress, as shown in FIG. 11A and FIG. 11B which are exemplary results of AFM images (1.5*1.5 μm$^2$) of the buried perovskite-ETL heterointerface with regular and flattened GBGs. The mean GBG side-angle increases by around 50% for the regular GBGs case (from 11.01° to 16.53°) while only a slight increase (12%; from 7.56° to) 8.49° is observed for the flattened GBGs case, as shown in FIG. 7K and FIG. 11C to FIG. 11D which are exemplary and measured GBG side-angle statistics of the buried perovskite-ETL heterointerface with regular and flattened GBGs. An exemplary result of X-ray diffraction (XRD) is shown in FIG. 12, which is XRD pattern of the perovskite film with the flattened GBG after 100 hours illumination of one-sun-intensity light, confirming the retained phase purity. The exemplary result of XRD also reveals no occurrence of phase degradation at this stage, attesting that the enlargement of voids is a result of GBG and interfacial morphological evolutions and excluding the effect of phase degradation.

Details of the testing and proof regarding mechanical properties and photothermal fatigue resistance are described as follows.

FIGS. 13A-13G illustrate exemplary schematic diagrams for influence of GBGs on chemical stability and optoelectronic properties of perovskite films, in which FIG. 13A to FIG. 13D are exemplary results of XRD and UV-vis absorption spectra of perovskite films with rigorous photothermal tests with 3-sun-intensity illumination and 80° C., and FIG. 13A and FIG. 13B are without GBG engineering and FIG. 13C and FIG. 13D are with GBG engineering; FIG. 13E is an exemplary results of the space-charge-limited current versus voltage plots for the capacitor-like perovskite devices in the metal-perovskite-metal setting as later described in the methods; FIG. 13F-FIG. 13G are exemplary results of time-resolved PL spectra for the perovskite films with regular and flattened GBGs, and the sample structures are schematically illustrated in the insets as perovskite/SnO$_2$/glass in FIG. 13F and perovskite/PMMA/epoxy/glass in FIG. 13G derived from the delaminated film side in FIG. 7A.

The chemical stability and optoelectronic properties of perovskite thin films with regular are further compared with those of the flattened GBGs. Regarding the chemical stability, accelerated aging test conditions (three-sun-intensity light generated using the white LEDs, couple with a sample temperature of 80° C.) are used to monitor the degradation kinetics of both film samples. FIG. 13A and FIG. 13B respectively show exemplary results of the XRD and UV-vis absorption spectra of perovskite films with regular GBGs after different times (0, 25, 50, 75, 100 hours) of aging, revealing quick degradation of perovskite phases into PbI$_2$. When GBGs are flattened, only trace amounts of PbI$_2$ are observed after 100 hours of aging, and the optical absorption behavior is mostly retained, as shown in FIG. 13C and FIG. 13D.

Figure 14:
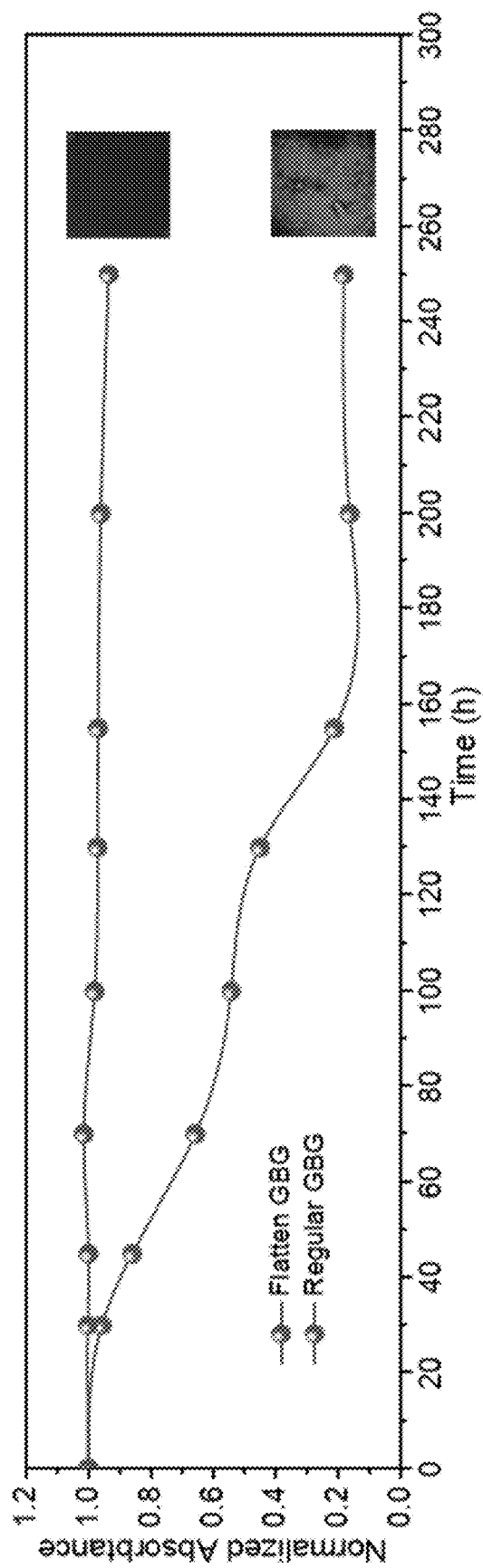
FIG. 14 is an exemplary result of absorbance variations as a function of storage time in ambit condition for perovskite films with regular and flattened GBGs.

Flattened GBGs also lead to obvious improvement in the ambient stability of the films under the testing conditions of 22° C. and 65% RH, which can be attributed to retarded ingression into the film of moisture from the air, as shown in FIG. 14 that is an exemplary result of absorbance (at 760 nm) variations as a function of storage time in ambit condition (22° C. 65% RBI) for perovskite films with regular and flattened G BGs, and insets are corresponding photographs of the thin films at 250 hours. The trap densities in both perovskite film samples are estimated using the space-charge-limited current (SCLC) measurements. An electron-only capacitor-like structure of SnO$_2$/perovskite/[6,6]-Phenyl C61 butyric acid methyl ester (PCBM)/Au. As shown in FIG. 13E, the trap-filled-voltage V$_{FTL}$ can be obtained through the kink point of the ohmic and trap-filled regimes. By using the equation of $$V_{TFL} = \frac{eNL^2}{2\varepsilon\varepsilon_0},$$

where e is the elementary charge, L is the thickness of perovskite film, ε is the relative dielectric constant of the perovskite and ε$_0$ is the vacuum permittivity. The trap density in the perovskite film after the GBG engineering is reduced to 1.54×10$^{14}$ cm$^{-3}$ as compared with 3.22×10$^{14}$ cm$^{-3}$ in the regular perovskite film, calculated based on the extracted parameters shown in Table I.

TABLE I

The parameters for the SCLC measurement

| Samples | N$_{trap}$(cm$^{-3}$) | V$_{TFL}$ (V) |
|---|---|---|
| Flattened GBG | 1.54 × 10$^{14}$ | 0.125 |
| Regular GBG | 3.22 × 10$^{14}$ | 0.262 |

Time-resolved PL (TRPL) spectra of the delaminated flipped perovskite film samples for both cases are further acquired. As shown in FIG. 13F, the TRPL spectra are fitted well with double exponential decay function ƒ(t)=A$_1$ exp(−t/τ$_1$)+exp(−t/τ$_2$), where A$_1$ and A$_2$ are the decay amplitudes, and τ$_1$ and τ$_2$ are the decay time constants. The fitted parameters are summarized in Table II.

TABLE II

Fitting parameters for the TRPL spectra of the perovskite films (bottom side; delaminated film from the ETL) using the bi-exponential functions, and two time-constants τ$_1$ and τ$_2$.

| Samples | A$_1$ | τ$_1$ (ns) | A$_2$ | τ$_2$ (ns) | τ (ns). |
|---|---|---|---|---|---|
| Flattened GBG | 0.36 | 471.72 | 0.49 | 112.30 | 383.70 |
| Regular GBG | 0.45 | 129.37 | 1.82 | 21.44 | 86.21 |

The average PL lifetime (τ$_{avg}$) for the film with flattened GBGs is 383.70 ns, significantly larger than that (86.21 ns) for the regular GBGs case, suggesting the suppression of non-radiative recombination. Then carrier-extracting properties of the perovskite-ETL heterointerfaces are compared with regular and flattened GBGs using TRPL, as shown in FIG. 13G. Although the intrinsic PL lifetime of the film is increased with the flattened GBGs, the PL quenching dynamics is faster in this film, showing τ$_{avg}$ of 3.33 ns as compared with that of 16.76 ns for the sample with regular GBGs, which can be found in Table III with the fitted parameters.

TABLE III

Fitting parameters for the TRPL spectra of the perovskite films (top side; on SnO$_2$ ETL-coated ITO glass) with the bi-exponential functions and two time-constants τ$_1$ and τ$_2$.

| Samples | A$_1$ | τ$_1$ (ns) | A$_2$ | τ$_2$ (ns) | τ (ns) |
|---|---|---|---|---|---|
| Flattened GBG | 1000.00 | 3.11 | 6.87 | 11.64 | 3.33 |
| Regular GBG | 1.17 | 28.95 | 6.28 | 10.50 | 16.76 |

Figure 15B:
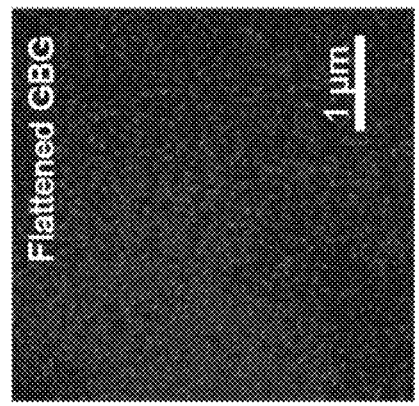
FIGS. 15A-15C are exemplary results of steady-state PL spectra and PL maps of the perovskite films with regular and flattened GBGs
Figure 15C:
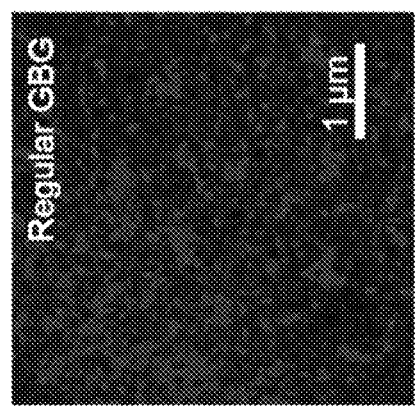
Figure 15A:
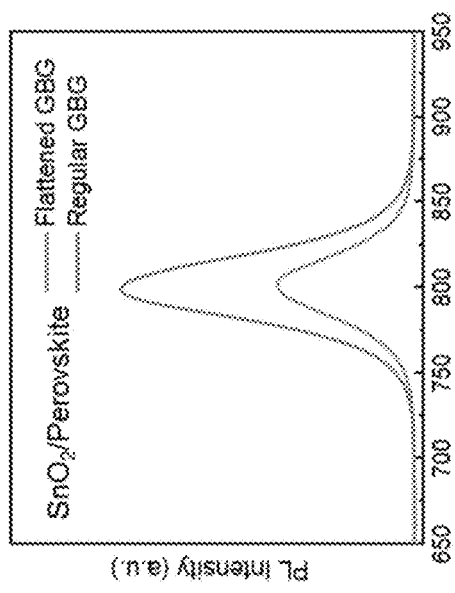

Steady-state PL spectra and PL mapping are also acquired, showing more effective PL quenching and uniform emission distribution in the film with flattened GBGs, as shown in FIGS. 15A-15C which are exemplary results of steady-state PL spectra and PL maps of the perovskite films with regular and flattened GBGs. The intensity of emission in the PL maps are normalized to their peak value. The comparison of PL maps showing more effective PL quenching and uniform emission distribution in the film with flattened GBGs. All these confirm not only better optoelectronic quality of the perovskite film with flattened GBGs but also more effective charge extraction across the resulting perovskite-ETL heterointerfaces.

Details of the testing and proof regarding solar cell performance and stability are described as follows.

FIGS. 16A-16E are exemplary results of influence of GBGs on photovoltaic performance and stability of PSCs, in which FIG. 16A is an exemplary result of current density-voltage (J-V) curves and EQE spectra of the champion PSC devices with regular and flattened GB grooves; FIG. 16B and FIG. 16C are exemplary results of corresponding current/PCE outputs at the maximum power points (MPPs); FIG. 16D is an exemplary result of damp heat test under 85% relative humidity (RH) and 85° C. heating; FIG. 16E is an exemplary result of a light soaking test (one-sun-intensity illumination, coupled with a sample temperature of 50° C.; in the nitrogen-filled glovebox) stabilities of PSCs with regular and flattened grooves.

The PSCs are fabricated to evaluate the effects of GBG engineering on device PCEs and stability. FIG. 16A shows the J-V curves of the PSC devices with regular and flattened GB grooves at reverse scan under stimulated AM 1.5G one-sun illumination. The GBG engineering has clearly improved the device operation, demonstrating a PCE of 23.75%, with a short-circuit current density ($J_{SC}$) of 24.55 mA cm$^{-2}$, an open-circuit voltage ($V_{OC}$) of 1.21 V and a fill factor (FF) of 0.80. For comparison, the PSCs without GBG engineering shows a PCE of 20.62% with a $V_{OC}$ of 1.14 V, a $J_{SC}$ of 23.2 mA cm' and a FF of 0.78. The steady-state photocurrent/PCE outputs of the devices are further monitored at maximum power point (MPP) bias for 200 s, as shown in FIG. 16B and FIG. 16C. The PCEs of the devices with and without GBG engineering are stabilized at 23.75% and 20.62%, respectively, as shown in FIG. 16C. The comparison of photovoltaic parameters is also summarized in Table IV. External quantum efficiencies (EQEs) of both devices are shown in the inset of FIG. 16A, showing consistent integrated current densities. The J-V parameters statistics of the 60 devices with and without the GBG engineering are further compared, as shown in FIGS. 17A-17E, demonstrating very good reproducibility of the PCE improvement, in which FIGS. 17A-17C are exemplary results of J-V parameter ($V_{OC}$, $J_{SC}$, PCE) statistics for the PSCs made with and without GBG engineering; and FIGS. 17D-17E are exemplary results of PCE statistics of PSCs with regular and flattened GBG, where 60 devices are counted for each case.

TABLE IV

Device parameters for PSCs with regular and flattened GBGs.

| Samples | Flattened GBG | Regular GBG |
| --- | --- | --- |
| PCE (%) | 23.75 | 20.62 |
| Voc (V) | 1.21 | 1.14 |
| Jsc (mA · cm$^2$) | 24.55 | 23.13 |
| FF | 0.80 | 0.78 |
| Stabilizing J at MPP (mA · cm$^2$) | 22.82 | 21.40 |
| Stabilizing PCE (%) | 23.75% | 20.62% |

Figure 18:
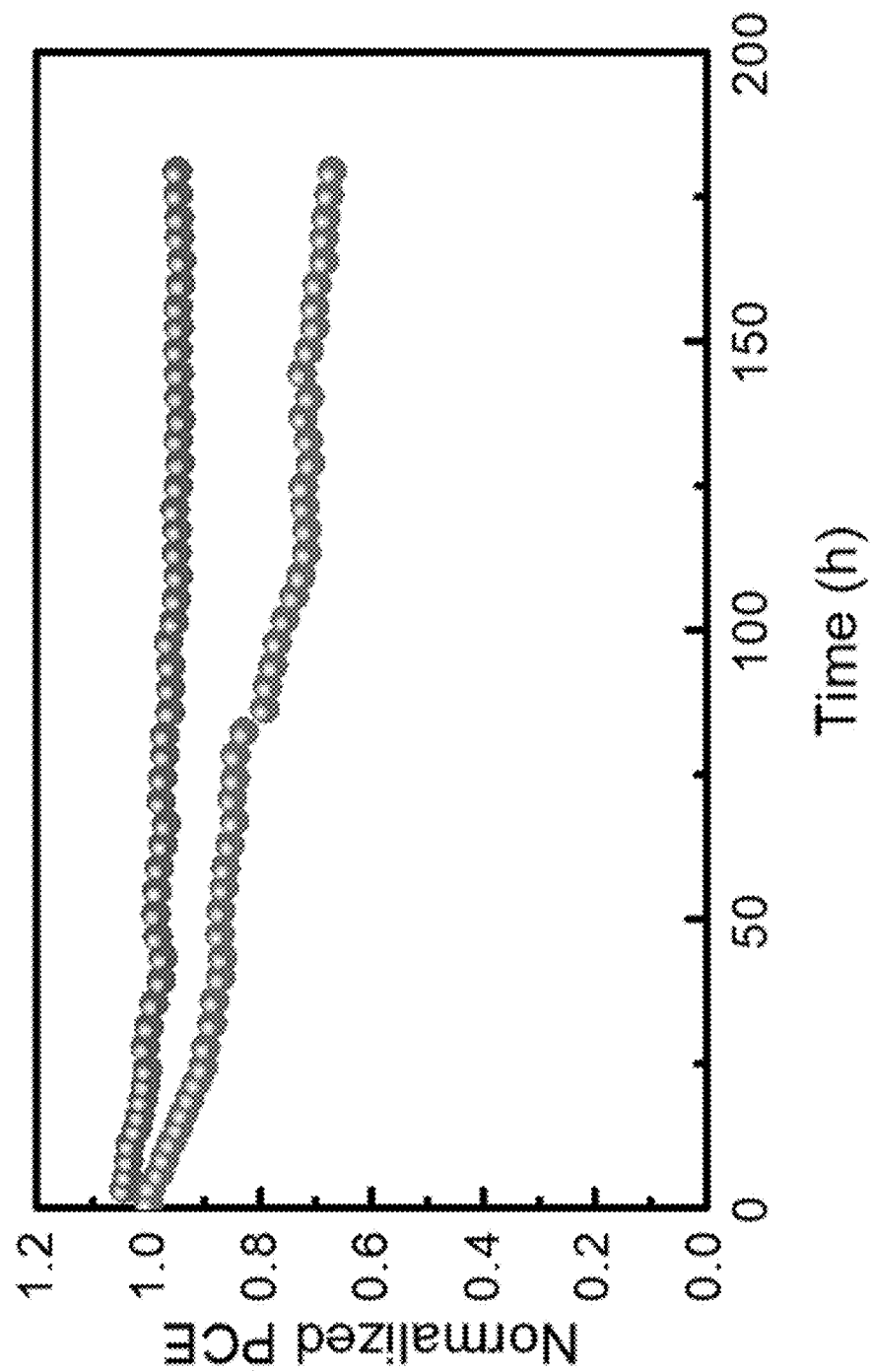
FIG. 18 which is an exemplary result of PCE evolution upon MPP tracking of the PSCs with regular and flattened GBGs under continuous light illumination.

The PSCs with GBG engineering exhibit improved stabilities under various test conditions. The PCE evolution upon MPP tracking is monitored under one-sun-intensity illumination, as show in FIG. 18 which is an exemplary result of PCE evolution upon MPP tracking of the PSCs with regular (red solid) and flattened (blue solid) GBGs under continuous light illumination, for example, one-sun-intensity light generated by white LEDs; flowing $N_2$. The PSC with the GBG engineering demonstrates 94.9% PCE retention after 180 hours as compared with 67.1% for the regular PSC, demonstrating excellent operational stability improvement. Note that more operational test time is not used, since the observed stability difference has already been striking at 180 hours. Damp heat tests are performed based on ISOS-D-3 protocol (85% RH and 85° C.) for encapsulated PSCs. With the GBG engineering, the PCE retention is as high as 94.8% after 440 hours testing. For comparison, the control device shows a rapid degradation in the initial 20 hours with only 59.0% retention of the original efficiency. Finally, the light soaking stability of PSCs is evaluated under one-sun intensity illumination in the nitrogen-filled glovebox at a stable temperature of 50° C. based on the ISOS-L-2I protocol. As shown in FIG. 16D, a typical GBG-engineered PSC delivers a high retention (93.0%) of initial PCE after 2000 hours testing is demonstrated, which clearly outperforms a regular PSC. These evidently increased device stabilities confirm the beneficial role of flattened GBGs at the perovskite-ETL heterointerface in terms of enhancing chemical stability and opto-mechanical reliability.

The significant role of GBG geometry in optoelectronic properties, chemical stability and most critically photothermal fatigue resistance of buried perovskite-ETL, heterointerface is demonstrated as above. It can be found that a chemical modification of this heterointerface that increases the interfacial energy will result into a flattening of GBGs. This fundamental knowledge can be translated to the device practice, leading to highly efficient PSCs with superior operational, environmental, and opto-mechanical reliability. Furthermore, in the present disclosure, both p-i-n or n-i-p structured PSC devices may be applied. The novel structure with a perovskite layer of the present invention, can be extended to other devices beyond solar cells, including light-emitting devices, memristors, and photodetectors.

Figure 19:
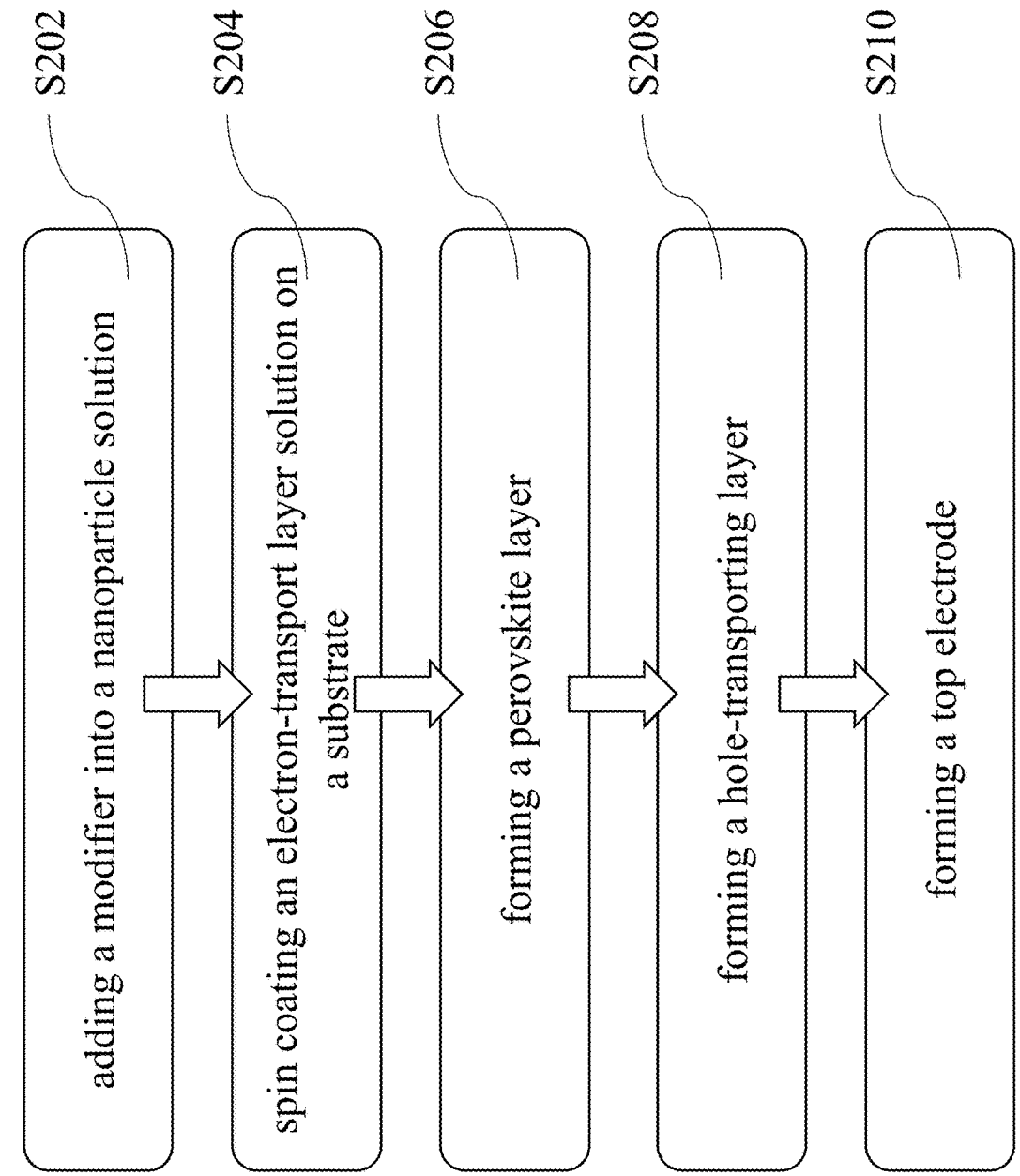
FIG. 19 illustrates a flow diagram of a method for manufacturing a perovskite solar cell.

FIG. 19 illustrates a flow diagram of a method 200 for manufacturing a perovskite solar cell, in which the method is provided with steps S202, S204, S206, S208, and S210.

At the step S202, a modifier is added into a nanoparticle solution for preparing and acquiring an ETL solution. In some embodiments, the modifier includes iso-butylammonium chloride (i-BACl), organic or inorganic halide ($AX_n$), or combinations thereof, where A is ethylammonium ($EA^+$), guanidinium ($GA^+$), n-propylammonium ($PA^+$), n-butylammonium ($n-BA^+$), cyclohexylammonium ($CA^+$), formamidinium ($FA^+$), methylammonium ($MA^+$) or phenethylamine ($PEA^+$), where X is $I^-$, $Cl^-$, $Br^-$, or a pseudohalide anion which comprises $SCN^-$, $COO^-$, or combinations thereof. In some embodiments, the nanoparticles solution may include $SnO_2$, $TiO_2$, ZnO, or combinations thereof. In one embodiment, the nanoparticle solution, such as $SnO_2$, $TiO_2$ or ZnO, can be diluted using distilled water or other alcohols: For example, dilution by 5 times. Then, the nanoparticles solution is prepared as A ml and is modified by the additive phase of B mg modifier, and a ration of A to B is 0.2. For example, for preparing the ETL solution, the acquired $SnO_2$ nanoparticles can be diluted using distilled water by 5 times, and then, for pre-burying i-BACl into $SnO_2$ ETLs, 1 mL $SnO_2$ nanoparticles solution can be modified by the modifier of 5 mg i-BACl.

At the step S204, the ETL solution is spin coated on a substrate with a bottom electrode for formation of an ETL layer over the substrate. As afore-mentioned, the substrate may be an ITO or FTO glass. In one embodiment, at least one ITO glass substrate is washed with cleaning fluid, deionized water, ethanol, and isopropanol sequentially. In one embodiment, the ETL solution can be spin coated on the ITO glass substrate at 3000 rpm for 30 s and then be annealed in an ambient air condition, such as annealing at 180° C. for 30 min in the ambient air. Thereafter, the ETL-coated substrate is transferred into a nitrogen-filled glovebox which is with $H_2O<0.01$ ppm and $O_2<0.01$ ppm.

At the step S206, a perovskite layer is formed above the ETL. In one embodiment, the perovskite layer can be formed from a $FA_{0.9}Cs_{0.1}PbI_3$ perovskite film or a $FA_{0.9}Cs_{0.07}MA_{0.03}Pb(I_{0.92}Br_{0.08})_3$ film. In one embodiment, for preparing the $FA_{0.9}Cs_{0.1}PbI_3$ perovskite thin film with flattened GBGs, a perovskite precursor solution with 1 M molar concentration is first prepared by co-dissolving 154.8 mg FAI, 26.0 mg CsI and 461.1 mg $PbI_2$ in 1 mL mixed solvent of DMF/DMSO (v/v, 7:3), in which additional 23.0 mg $PbI_2$ is added into the perovskite precursor. Then, 50 µL of this precursor is spread on the $SnO_2$ ETL coated ITO substrate, followed by a 3-stage spin-coating process (500 rpm for 5 s, 1000 rpm for 10 s and 6000 rpm for 30 s). During the next stage, 400 µL of toluene (TB) is dripped at the center of the spinning substrate. Then, the spun film is annealed at 170° C. for 5 min to form the final perovskite film. As such, the film is fabricated on the ETL coated ITO substrate with the additional phase pre-buried therein. In one embodiment, for preparing $FA_{0.9}Cs_{0.07}MA_{0.03}Pb(I_{0.92}Br_{0.08})_3$ perovskite thin films with flattened GBGs, a perovskite precursor solution with 1.35 M molar concentration is first prepared by co-dissolving 6.4 mg MAI, 13.5 mg FABr, 24.6 mg CsI, 39.6 mg $PbBr_2$, 190.4 mg FAI, and 574 mg $PbI_2$ in 1 mL mixed solvent of DMF/DMSO (v/v, 4:1), in which additional 17.2 mg $PbI_2$ is added into the perovskite precursor. Then, 50 μL of this precursor is spread on the ETL coated ITO substrate, followed by a 2-stage spin-coating process (5000 rpm for 10 s and then 4000 rpm for 30 s). During the second stage, 300 μL of ethyl acetate (EA) is dripped at the center of the spinning substrate. Then, the spun film is annealed at 100° C. for 40 min to form the final perovskite film. The film is fabricated on the ETL coated ITO substrate with the additional phase pre-buried therein. In some embodiments, the perovskite layer is formed with a thickness in a range from 250 nm to 600 nm. In some embodiments, the perovskite layer can be formed with a thickness in a range from 270 nm to 330 nm for further controlling.

At the step S208, a HTL is formed over the perovskite layer. The HTL can be formed by spin coating a HTL solution over the perovskite layer. In one embodiment, for preparing the HTL solution, 72.3 mg Spiro-OMeTAD, 28.8 μL 4-tert-butylpyridine, 17.5 μL lithium bis (trifluoromethyl sulphonyl) imide acetonitrile solution (520 mg·mL$^{-1}$) are dissolved into 1 mL CB; subsequently, the HTL is deposited on top of the perovskite layer by spin-coating at 4000 rpm for 30 s.

At the step S210, a top electrode is formed over the HTL. In one embodiment, a 80-nm Au electrode is thermally evaporated on top of the HTL.

The experiment or test details are stated as follows.

Regarding materials characterization and property measurement, the surface geometry of GBGs is measured using an AFM platform (RTESP-300, Bruker, USA) using a 0.01-0.025 ohm-cm antimony (n-)doped Si tip in a non-contact tapping mode. The top-view and cross-sectional microstructures of the thin films are observed using a scanning electron microscope. XRD is performed using a high-resolution diffractometer with Cu Kα radiation (λ=1.5406 Å) in the θ-2θ scan mode. UV-vis spectra are obtained using a home-built spectrophotometer system. TRPL and steady-state PL are measured using a 375-nm picosecond laser as the excitation. The PL signal is directed into a spectrograph and further collected by an electron-multiplying charge-coupled device for the steady-state PL and a streak camera for the TRPL. PL mapping is performed on an optical microscope with a filter (long pass after 726 nm) and a UV light source (250-450 nm). All PL mapping images are captured using a digital microscope camera. SCLC measurements are performed using a 2612 Source Meter) using a capacitor-like device structure of ITO/SnO$_2$/perovskite/PCBM/Ag. All the measurements are performed under ambient conditions with a relative humidity below 40%.

Regarding mechanical behavior testing, for the perovskite film delamination tests, sample specimens with a multi-layer structure of glass/ITO/SnO$_2$/perovskite/PMMA/epoxy/ITO/glass are applied. To prepare such specimens, a SnO$_2$ ETL with and without pre-buried i-BACl are deposited on the ITO coated glasses. Then, the perovskite layer of a thickness of ~300 nm is deposited, followed by the spin-coating of a PMMA layer using its 10 wt % CB solution at 6000 rpm for 60 s. The purpose of the PMMA coating is to protect the perovskite from chemical degradation. Then, a thin layer of epoxy (2 μm) is applied to glue a glass substrate onto the film structure. The epoxy is cured for 24 hours in the dry air condition (less than 20% RH) to finalize the specimen fabrication. The effective area of a typical sample specimen is 0.64 cm$^2$. The normalized delaminated area is defined by the ratio of the delaminated film area being divided by the whole sample area.

For the stress-displacement curve measurements, a double-cantilever beam delamination technique is used on a tensile tester using a method reported in the literature. The structure of the specimens with an area of 15 mm*15 mm is glass/ITO/SnO$_2$/perovskite/PMMA/epoxy/glass. The PMMA layer (10 wt % in CB) is spin-coated on the perovskite layer at 6000 rpm for 60 s, followed by generating a planar defect using 5 mm tape adhesion at the edge of the PMMA-perovskite-ETL multilayer. Finally, a thin layer of epoxy (2 μm) is applied to glue a glass substrate (area: 15 mm*15 mm) onto the PMMA layer. The epoxy is cured for 24 hours in the dry air condition (less than 20% RH) to finalize the specimen fabrication. The stress-strain curve measurement procedure is as follows: firstly, the adhesion surface of the specimen and the aluminum alloy clevis are fully cleaned using alcohol. The upper and lower surfaces of the specimens are adhered to the lower and higher devises using epoxy glue, respectively. To enhance the adhesion, the specimens are pressed by a 100 N force for 30 seconds followed by 7-days epoxy cured. Following that, the specimen is mounted on the tensile testing instrument fixture. The experiment is manually pre-tension to 5 N slowly. The tensile rate of the machine is controlled by displacement of the devises. For a typical perovskite sample, the final rate is set to 0.01 mm/s according to the repeatability of the results after several comparison tests. The termination condition of the experiment is the detachment of the upper and lower glasses, or the load is reduced to below 1 N. For calculating traction stress (S) and specific fracture energy (W) calculation, the following methods are used: S=F/A, where F is the magnitude of load, A is the area of specimen; $W=\int_0^{\varepsilon_0}\sigma d\varepsilon$, where σ is measured stress, ε is measured strain.

Regarding DFT calculation, the first-principles computations are performed based on DFT methods as implemented in the Vienna ab initio simulation package (VASP 5.4). An energy cutoff of 520 eV is employed. Structural geometry optimization is performed using Perdew-Burke-Ernzerhof exchange-correlation functional and with energy convergence and force convergence of 10$^{-6}$ eV and 0.02 eV Å$^{-1}$, respectively. Grimme's DFT-D3 correction is adopted to describe the long-range van der Waals interaction. A Γ-centred (2*2*1) k-point mesh is used to sample the Brillouin zone. The ion cores are described by using the projector augmented wave (PAW) method. A 2*2 supercell of (001)-plane rutile SnO$_2$ surfaces is used. The slab consists of five symmetric layers of SnO$_2$ with BA and Cl ions absorbing on the surface, with a vacuum size of about 20 Å.

Regarding solar cell testing, the current density-voltage (J-V) characterization for PSCs is measured by a source meter under AM 1.5 G one-sun illumination (100 mW·cm$^{-2}$) generated by a solar simulator in the nitrogen-filled glovebox. The device area is 0.05 cm$^2$ as defined with a shadow mask. The scans are performed in the voltage range of 0 to 1.3 V at the reverse direction (from $V_{OC}$ to $J_{SC}$) with a step size of 0.02 V and a dwell time of 10 ms. Steady-state current/PCE outputs are measured at the voltages determined from the MPPs of the reverse-scan J-V curves. The external quantum efficiency (EQE) measurement is measured using a quantum efficiency measurement system. For light-soaking stability tests, unencapsulated PSCs are placed in a sealed quartz cell holder in $N_2$-filled glovebox under a one-sun-intensity illumination generated using white LEDs. For operational stability tests, PSCs are biased at the maximum-power-point voltage using a potentiostat under one-sun-intensity white-LED illumination at around 50° C. For damp heat tests, encapsulated PSCs are placed in a climate chamber with a controlled humidity of 85% RH and temperature of 85° C.

The functional units and modules of the apparatuses, systems, and/or methods in accordance with the embodiments disclosed herein may be implemented using computing teaching aids, computer processors, or electronic circuitries including but not limited to application specific integrated circuits (ASIC), field programmable gate arrays (FPGA), microcontrollers, and other programmable logic teaching aids configured or programmed according to the teachings of the present disclosure. Computer instructions or software codes running in the computing teaching aids, computer processors, or programmable logic teaching aids can readily be prepared by practitioners skilled in the software or electronic art based on the teachings of the present disclosure.

All or portions of the methods in accordance with the embodiments may be executed in one or more computing teaching aids including server computers, personal computers, laptop computers, and mobile computing teaching aids such as smartphones and tablet computers.

The embodiments may include computer storage media, transient and non-transient memory teaching aids having computer instructions or software codes stored therein, which can be used to program or configure the computing teaching aids, computer processors, or electronic circuitries to perform any of the processes of the present invention. The storage media, transient and non-transient memory teaching aids can include, but are not limited to, floppy disks, optical discs, Blu-ray Disc, DVD, CD-ROMs, and magneto-optical disks, ROMs, RAMs, flash memory teaching aids, or any type of media or teaching aids suitable for storing instructions, codes, and/or data.

Each of the functional units and modules in accordance with various embodiments also may be implemented in distributed computing environments and/or Cloud computing environments, wherein the whole or portions of machine instructions are executed in distributed fashion by one or more processing teaching aids interconnected by a communication network, such as an intranet, Wide Area Network (WAN), Local Area Network (LAN), the Internet, and other forms of data transmission medium.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

What is claimed is:

1. A method for manufacturing a perovskite solar cell, comprising:
    adding a modifier into a nanoparticle solution to acquire an electron-transport layer solution, wherein the modifier comprises iso-butylammonium chloride (i-BACl), organic or inorganic halide ($AX_n$), or combinations thereof, where A is ethylammonium ($EA^+$), guanidinium ($GA^+$), n-propylammonium ($PA^+$), n-butylammonium ($n-BA^+$), cyclohexylammonium ($CA^+$), formamidinium ($FA^+$), methylammonium ($MA^+$) or phenethylamine ($PEA^+$), where X is I, Cl, Br, or a pseudohalide anion which comprises thiocyanate ($SCN^-$), carboxylate ion (COO), or combinations thereof, and wherein the nanoparticles solution is prepared as A ml and is modified by the modifier with B mg i-BACl, and a ratio of A to B is 0.2;
    spin coating the electron-transport layer solution on a substrate with a bottom electrode to form an electron-transport layer with an additive phase buried therein over the substrate;
    forming a perovskite layer above the electron-transport layer, such that a plurality of grains of the perovskite layer are formed on a top surface of the electron-transport layer and are located on an entirety of the electron-transport layer, wherein the forming the perovskite layer results in interfacial voids between the adjacent grains and the electron-transport layer, and wherein the interfacial voids define grain boundary grooves (GBGs) with a mean GBG side-angle measured from a top of the interfacial void relative to a horizontal direction, and the mean GBG side-angle is 7.56°; and
    forming a hole-transporting layer over the perovskite layer.

2. The method of claim 1, wherein the perovskite layer is formed with a thickness in a range from 250 nm to 600 nm.

3. The method of claim 1, further comprising annealing the electron-transport layer in an ambient air condition.

4. The method of claim 1, wherein the nanoparticles solution comprises $SnO_2$, $TiO_2$, ZnO, or combinations thereof.

5. The method of claim 1, wherein the mean GBG side-angle of the perovskite layer is modified to be decreased from 11.01° to 7.56° by adding i-BACl into the nanoparticle solution.

6. The method of claim 5, wherein the mean GBG side-angle of 7.56° defines the flattened GBGs that result in an average traction stress of 2.425 MPa.

7. The method of claim 6, wherein the mean GBG side-angle of 7.56° defines the flattened GBGs that result in a maximum traction stress of 3.583 MPa.

8. The method of claim 7, wherein the mean GBG side-angle of 7.56° defines the flattened GBGs that result in an average specific fracture energy of 8855 $KJ/m^3$.

* * * * *